(12) United States Patent
Lee et al.

(10) Patent No.: US 12,086,343 B2
(45) Date of Patent: Sep. 10, 2024

(54) TOUCH DISPLAY DEVICE

(71) Applicant: LG Display Co., LTD., Seoul (KR)

(72) Inventors: Youngsoo Lee, Paju-si (KR); Jonghyun Han, Paju-si (KR); YeonGyeong Bae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/352,656

(22) Filed: Jul. 14, 2023

(65) Prior Publication Data

US 2023/0359295 A1 Nov. 9, 2023

Related U.S. Application Data

(63) Continuation of application No. 17/522,772, filed on Nov. 9, 2021, now Pat. No. 11,747,928.

(30) Foreign Application Priority Data

Nov. 26, 2020 (KR) .......................... 10-2020-0161233

(51) Int. Cl.
| | |
|---|---|
| *G06F 3/041* | (2006.01) |
| *G06F 3/044* | (2006.01) |
| *H10K 50/844* | (2023.01) |
| *H10K 59/131* | (2023.01) |
| *H10K 59/40* | (2023.01) |

(52) U.S. Cl.
CPC .......... *G06F 3/0412* (2013.01); *G06F 3/0446* (2019.05); *H10K 50/844* (2023.02); *H10K 59/131* (2023.02); *H10K 59/40* (2023.02)

(58) Field of Classification Search
CPC . G06F 2203/04103; G06F 2203/04112; G06F 3/0412; G06F 3/04164; G06F 3/0418; G06F 3/0445; G06F 3/0446; H10K 50/844; H10K 59/131; H10K 59/40; H10K 59/873
See application file for complete search history.

(56) References Cited

U.S. PATENT DOCUMENTS

| | | | |
|---|---|---|---|
| 2016/0306472 A1 | 10/2016 | Park et al. | |
| 2018/0061899 A1 | 3/2018 | Oh et al. | |
| 2018/0350884 A1* | 12/2018 | Won ....................... | H10K 50/84 |
| 2019/0302934 A1 | 10/2019 | Rhe et al. | |
| 2019/0302944 A1 | 10/2019 | Rhe et al. | |
| 2020/0258913 A1* | 8/2020 | Park ....................... | H10K 59/40 |
| 2022/0164051 A1 | 5/2022 | Lee et al. | |
| 2022/0320237 A1* | 10/2022 | Liu ........................ | G02F 1/1333 |

FOREIGN PATENT DOCUMENTS

| | | |
|---|---|---|
| CN | 110321024 A | 10/2019 |
| CN | 110347279 A | 10/2019 |

* cited by examiner

*Primary Examiner* — Robin J Mishler
(74) *Attorney, Agent, or Firm* — Seed IP Law Group LLP

(57) ABSTRACT

A touch display device includes a touch planarization film. The touch planarization film may be disposed on an inclined portion of an encapsulation layer in a non-active area of a display panel, and a touch routing line may be disposed on the planarized area of the touch planarization film, so that it is possible to reduce parasitic capacitance between the touch routing line and a display signal line located under the encapsulation layer without increasing dimensions of the non-active area. Therefore, it is possible to easily adjust a width of the touch routing line and reduce the parasitic capacitance deviation between the touch routing lines, thereby improving the performance of the touch sensing.

18 Claims, 17 Drawing Sheets

TOUCH DISPLAY DEVICE

CROSS REFERENCE TO RELATED APPLICATION

This application is a continuation of U.S. application Ser. No. 17/522,772 filed on Nov. 9, 2021, which claims priority from Korean Patent Application No. 10-2020-0161233, filed on Nov. 26, 2020, which are hereby incorporated by reference for all purposes as if fully set forth herein.

BACKGROUND

Technical Field

Embodiments of the present disclosure are related to a touch display device.

Description of the Related Art

The growth of the information society leads to increased demand for display devices to display images and use of various types of display devices, such as liquid crystal display devices, organic light emitting display devices, etc.

The display devices, for providing more various functions to a user, provide a function that recognizes a touch by a finger or a pen of the user being contacted to a display panel and performs an input process based on a recognized touch.

The display devices can comprise a plurality of touch electrodes disposed on the display panel, or imbedded in the display panel. And the display devices can sense a touch of the user to the display panel by detecting a change of a capacitance occurred by the touch of the user.

The touch electrode disposed in the active area of the display panel may be electrically connected to a touch driving circuit by a touch routing line disposed in the non-active area. In addition, there may be arranged a plurality of lines to which a signal or voltage for driving a display are applied in an area overlapping the area in which the touch routing line is disposed.

BRIEF SUMMARY

The inventors have realized that a parasitic capacitance may be formed between the touch routing line and the signal line for driving the display, and there may be a problem that the accuracy of touch sensing may be deteriorated due to the parasitic capacitance.

Embodiments of the present disclosure provide a method capable of reducing the parasitic capacitance between touch routing line for touch sensing and signal line for driving display.

Embodiments of the present disclosure provide a method capable of reducing the deviation of parasitic capacitance formed between the touch routing line and the signal line for driving the display, and improving the uniformity and accuracy of touch sensing.

Embodiments of the present disclosure provide a touch display device including an encapsulation layer disposed on at least a portion of a non-active area and an active area, and including an inclined portion located in the non-active area, a plurality of touch electrodes located on the encapsulation layer in the active area, a plurality of touch routing lines located on the encapsulation layer in the non-active area and electrically coupled to at least one of the plurality of touch electrodes, and a touch planarization film located outside the active area, disposed in at least a portion of the non-active area, disposed on the encapsulation layer in at least a portion of an area overlapping the inclined portion of the encapsulation layer, and located under the plurality of touch routing lines.

Embodiments of the present disclosure provide a touch display device including an encapsulation layer disposed on at least a portion of a non-active area and an active area, and including an inclined portion located in the non-active area, a touch buffer film located on the encapsulation layer, a plurality of touch electrodes and a plurality of touch routing lines disposed on the touch buffer film, and a touch planarization film disposed in the non-active area and disposed between at least a portion of the inclined portion of the encapsulation layer and the touch buffer film.

According to embodiments of the present disclosure, a touch planarization film is disposed between an inclined portion of the encapsulation layer and a touch routing line in the non-active area of a display panel, so that it is possible to reduce parasitic capacitance between the touch routing line and a display signal line located under the encapsulation layer.

According to embodiments of the present disclosure, it is possible to easily adjust a width of the touch routing line by reducing the parasitic capacitance deviation between the touch routing lines and the display signal line and reduce a load of the touch routing line, thereby improving the uniformity and accuracy of touch sensing.

BRIEF DESCRIPTION OF THE SEVERAL VIEWS OF THE DRAWINGS

The above and other technical features and advantages of the present disclosure will be more clearly understood from the following detailed description, taken in conjunction with the accompanying drawings, in which.

DETAILED DESCRIPTION

Figure 1:
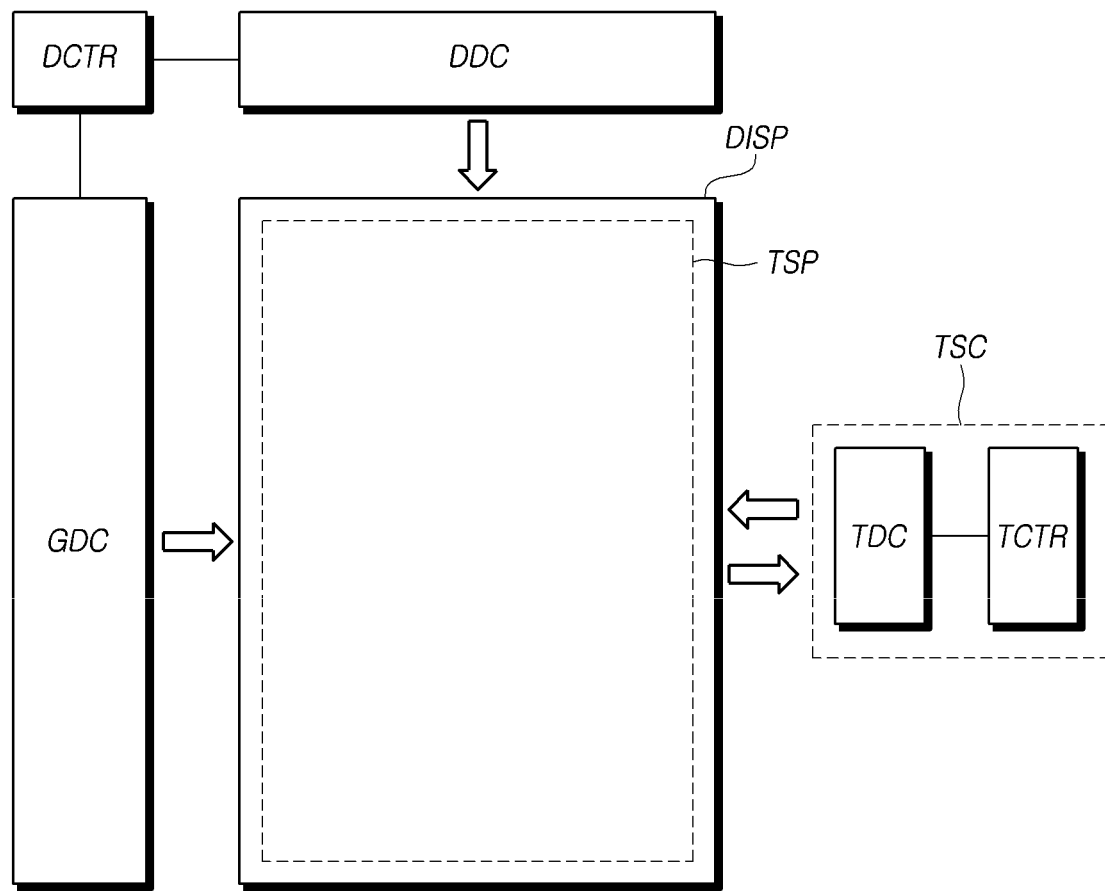
FIG. 1 is a diagram illustrating a system configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a diagram illustrating a system configuration of a touch display device according to embodiments.

Referring to FIG. 1, the touch display device according to embodiments of the present disclosure can provide both an image display function and a touch-sensing function.

To provide the image display function, the touch display device according to embodiments of the present disclosure can comprise: a display panel DISP in which a plurality of data lines and a plurality of gate lines are disposed and a plurality of subpixels corresponding to the plurality of data lines and the plurality of gate lines are arrayed; a data driver (or data driver circuit) DDC driving the plurality of data lines; a gate driver (or gate driver circuit) GDC driving the plurality of gate lines; a display controller DCTR controlling the data driver DDC and gate driver GDC, and the like.

Each of the data driver DDC, the gate driver GDC, and the display controller DCTR can be implemented as one or more separate components. In some cases, two or more of the data driver DDC, the gate driver GDC, and the display controller DCTR can be integrated into a single component. For example, the data driver DDC and the display controller DCTR can be implemented as a single integrated circuit (IC) chip.

To provide the touch-sensing function, the touch display device according to embodiments of the present disclosure can comprise: a touch panel TSP including a plurality of touch electrodes; and a touch-sensing circuit TSC supplying a touch driving signal to the touch panel TSP, detecting a touch-sensing signal from the touch panel TSP, and detecting a touch of a user or determining a touch position (touch coordinates) on the touch panel TSP on the basis of a detected touch-sensing signal.

For example, the touch-sensing circuit TSC can comprise: a touch driving circuit TDC supplying a touch driving signal to the touch panel TSP and detecting a touch-sensing signal from the touch panel TSP; a touch controller TCTR determining at least one of the touch of the user and the touch coordinates on the basis of the touch-sensing signal detected by the touch driving circuit TDC, and the like.

The touch driving circuit TDC can comprise a first circuit part supplying the touch driving signal to the touch panel TSP and a second circuit part detecting the touch-sensing signal from the touch panel TSP.

The touch driving circuit TDC and the touch controller TCTR can be provided as separate components or, in some cases, can be integrated into a single component.

In addition, each of the data driver DDC, the gate driver GDC, and the touch driving circuit TDC is implemented as one or more ICs, and in terms of electrical connection to the display panel DISP, can have a chip-on-glass (COG) structure, a chip-on-film (COF) structure, a tape carrier package (TCP) structure, or the like. In addition, the gate driver GDC can have a gate-in-panel (GIP) structure.

In addition, each of the circuit configurations DDC, GDC, and DCTR for display driving and the circuit configurations TDC and TCTR for touch sensing can be implemented as one or more separate components. In some cases, one or more of the display driving circuit configurations DDC, GDC, and DCTR and one or more of the touch-sensing circuit configurations TDC and TCTR can be functionally integrated into one or more components.

For example, the data driver DDC and the touch driving circuit TDC can be integrated into one or more IC chips. In a case in which the data driver DDC and the touch driving circuit TDC are integrated into two or more IC chips, each of the two or more IC chips can have both a data driving function and a touch driving function.

In addition, the touch display device according to embodiments of the present disclosure can be various types of devices, such as an organic light-emitting diode (OLED) display device and a liquid crystal display (LCD) device. Hereinafter, the touch display device will be described as an OLED display device for the sake of brevity. That is, although the display panel DISP can be various types of devices, such as an OLED and an LCD, the display panel DISP will be described as an OLED panel as an example for the sake of brevity.

In addition, as will be described later, the touch panel TSP can comprise a plurality of touch electrodes to which the touch driving signal is applicable or from which the touch-sensing signal is detectable; a plurality of touch routing lines connecting the plurality of touch electrodes to the touch driving circuit TDC; and the like.

The touch panel TSP can be located outside of the display panel DISP. That is, the touch panel TSP and the display panel DISP can be fabricated separately and combined thereafter. Such a touch panel TSP is referred to as an add-on touch panel.

Alternatively, the touch panel TSP can be disposed inside of the display panel DISP. That is, when the display panel DISP is fabricated, touch sensor structures of the touch panel TSP, including the plurality of touch electrodes, the plurality of touch routing lines, and the like, can be provided together with electrodes and signal lines used for the display driving. Such a touch panel TSP is referred to as an in-cell touch panel. Hereinafter, for the sake of brevity, the touch panel TSP will be described as an in-cell touch panel TSP as an example.

Figure 2:
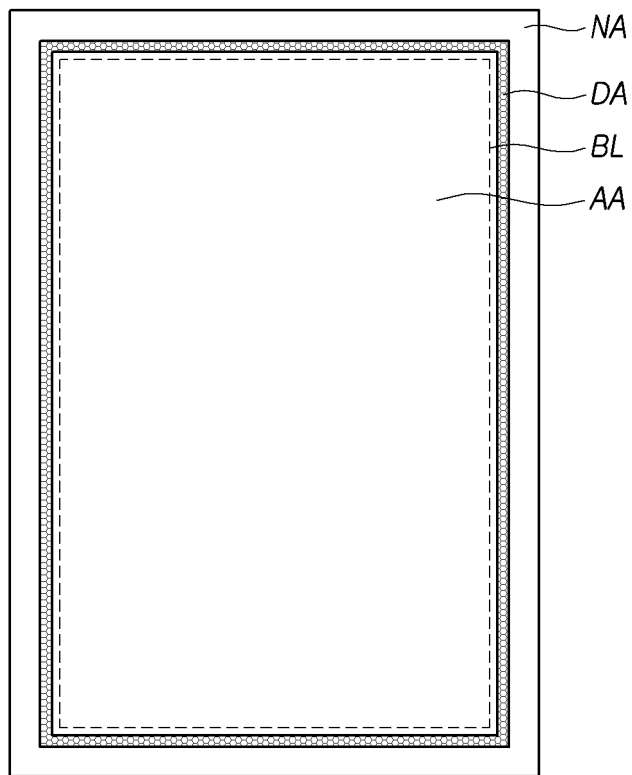
FIG. 2 is a diagram schematically illustrating a display panel of a touch display device according to embodiments of the present disclosure.

FIG. 2 is a diagram schematically illustrating the display panel DISP of the touch display device according to embodiments of the present disclosure.

Referring to FIG. 2, the display panel DISP can comprise an active area AA on which images are displayed and a non-active area NA located outside of an outer boundary line BL of the active area AA.

In the active area AA of the display panel DISP, a plurality of subpixels for displaying images are arranged, and a variety of electrodes and signal lines for the display driving area are disposed.

In addition, the plurality of touch electrodes for the touch sensing, the plurality of touch routing lines electrically connected to the plurality of touch electrodes, and the like can be disposed in the active area AA of the display panel DISP. Accordingly, the active area AA can also be referred to as a touch-sensing area in which the touch sensing can be performed.

In the non-active area NA of the display panel DISP, link lines produced by extending a variety of signal lines disposed in the active area AA or link lines electrically connected to the variety of signal lines disposed in the active area AA and pads electrically connected to the link lines can be disposed. The pads disposed in the non-active area NA can be bonded or electrically connected to the display driving circuits, such as DDC and GDC.

In addition, in the non-active area NA of the display panel DISP, link lines produced by extending a plurality of touch routing lines disposed in the active area AA or link lines electrically connected to the plurality of touch routing lines disposed in the active area AA and pads electrically connected to the link lines can be disposed. The pads disposed in the non-active area NA can be bonded or electrically connected to the touch driving circuit TDC.

In the non-active area NA, portions produced by expanding portions of the outermost touch electrodes among the plurality of touch electrodes disposed in the active area AA can be provided, and one or more electrodes (e.g., touch electrodes) made of substantially the same material as the plurality of touch electrodes disposed in the active area AA can be further disposed.

That is, the entirety of the plurality of touch electrodes disposed in the display panel DISP can be located in the active area AA, specific touch electrodes (e.g., the outermost touch electrodes) among the plurality of touch electrodes disposed in the display panel DISP can be located in the non-active area NA, or specific touch electrodes (e.g., the outermost touch electrodes) among the plurality of touch electrodes disposed in the display panel DISP can extend across at least a portion of the active area AA and at least a portion of the non-active area NA.

In addition, referring to FIG. 2, the display panel DISP of the touch display device according to embodiments of the present disclosure can comprise a dam area DA in which a dam DAM (see FIG. 9) is disposed, the dam DAM serving to prevent a layer (e.g., an encapsulation layer in the OLED display panel) in the active area AA from collapsing.

The dam area DA can be located at the boundary between the active area AA and the non-active area NA, in a location of the non-active area NA at the periphery of the active area AA, or the like.

The dam disposed in the dam area DA can be disposed to surround the active area AA in all directions or only at the periphery of one or more portions (e.g., portions in which a fragile layer is located) of the active area AA.

The dams disposed in the dam area DA can be connected to be made as a single pattern or to be made as two or more separate patterns. In addition, in the dam area DA, only a first dam can be disposed, or two dams (e.g., a first dam and a second dam) can be disposed, or three or more dams can be disposed.

In the dam area DA, the first dam can only be provided in one direction, and both the first dam and the second dam can be provided in the other direction.

Figure 3:
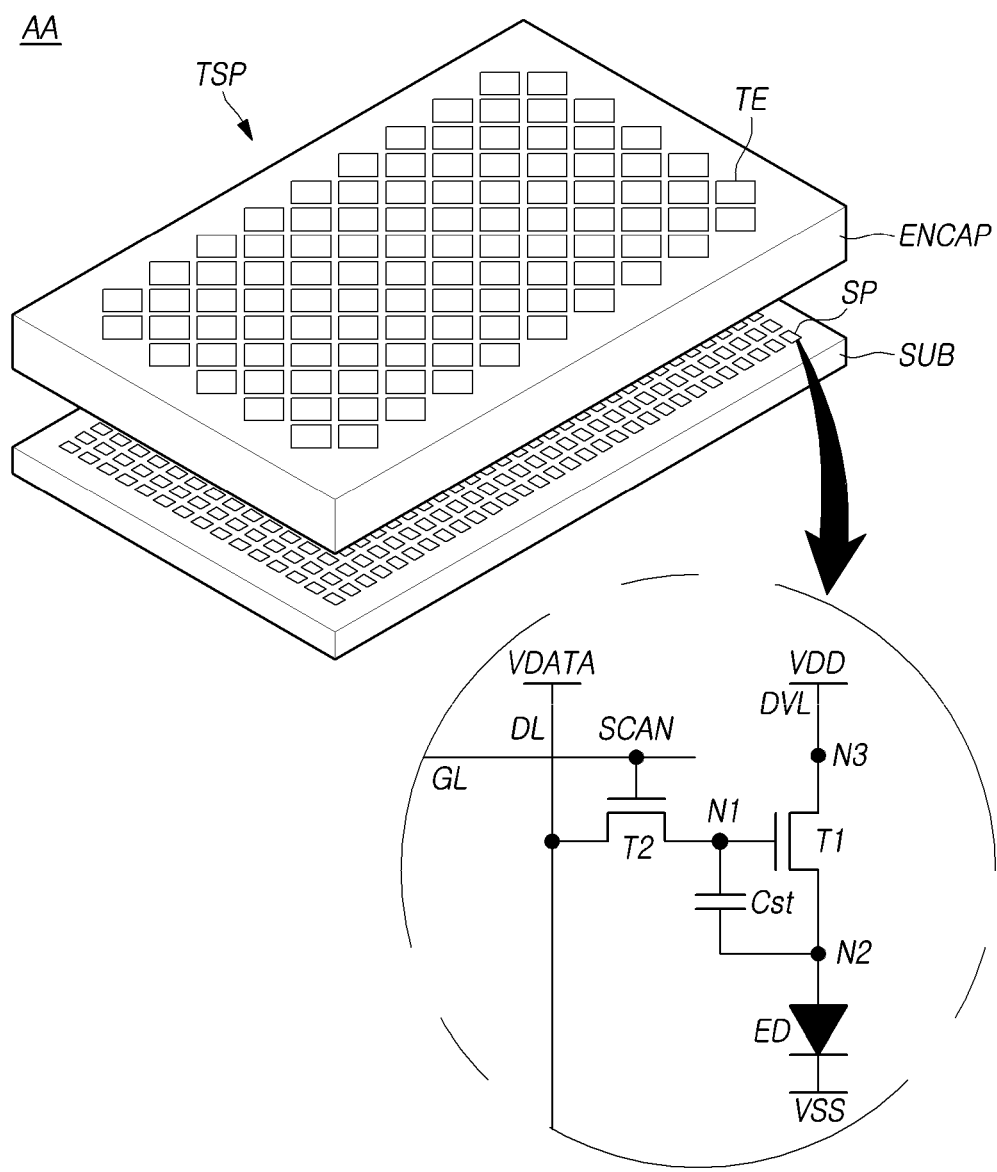
FIG. 3 is a diagram illustrating a structure in which a touch panel is disposed as an in-cell structure in a display panel according to embodiments of the present disclosure.

FIG. 3 is a diagram illustrating a structure in which the touch panel TSP is disposed as an in-cell structure in the display panel DISP according to embodiments of the present disclosure.

Referring to FIG. 3, a plurality of subpixels SP are arrayed on a substrate SUB in the active area AA of the display panel DISP.

Each of the subpixels SP can comprise an emitting device ED, a first transistor T1 driving the emitting device ED, a second transistor T2 delivering a data voltage VDATA to a first node N1 of the first transistor T1, a storage capacitor Cst maintaining a predetermined voltage or selected voltage for a single frame, and the like.

The first transistor T1 can comprise the first node N1 to which the data voltage VDATA is applicable, a second node N2 electrically connected to the emitting device ED, and a third node N3 to which a driving voltage VDD is applied from a driving voltage line DVL. The first node N1 can be a gate node, the second node N2 can be a source node or a drain node, and the third node N3 can be a drain node or a source node. Such a first transistor T1 is also referred to as a driving transistor driving the emitting device ED.

The emitting device ED can comprise a first electrode (e.g., an anode), an emissive layer, and a second electrode (e.g., a cathode). The first electrode can be electrically connected to the second node N2 of the first transistor T1, and the second electrode can have a base voltage VSS applied thereto.

The emissive layer of the emitting device ED can be an organic emissive layer containing an organic material. In this case, the emitting device ED can be an organic light-emitting diode (OLED).

The second transistor T2 can be on/off controlled by a scan signal SCAN applied through a gate line GL and be electrically connected to the first node N1 of the first transistor T1 and a data line DL. Such a second transistor T2 is also referred to as a switching transistor.

When the second transistor T2 is turned on by the scan signal SCAN, the second transistor T2 delivers the data voltage VDATA supplied through the data line DL to the first node N1 of the first transistor T1.

The storage capacitor Cst can be electrically connected to the first node N1 and the second node N2 of the first transistor T1.

As illustrated in FIG. 3, each of the subpixels SP can have a 2T1C structure comprised of two transistors T1 and T2 and a single capacitor Cst. In some cases, each of the subpixels SP can further comprise one or more transistors or one or more capacitors.

The storage capacitor Cst can be an external capacitor intentionally designed to be disposed externally of the first transistor T1, rather than a parasitic capacitor (e.g., Cgs or Cgd), e.g., an internal capacitor present between the first node N1 and the second node N2 of the first transistor T1.

Each of the first transistor T1 and the second transistor T2 can be an n-type transistor or a p-type transistor.

As described above, circuit components, including the emitting device ED, two or more transistors T1 and T2, and one or more capacitor Cst, are disposed in the display panel DISP. Since such circuit components (in particular, the emitting device ED) are vulnerable to external moisture, oxygen, or the like, an encapsulation layer ENCAP preventing external moisture or oxygen from penetrating the circuit components (in particular, the emitting device ED) can be disposed in the display panel DISP.

Such an encapsulation layer ENCAP can be a single layer or have a multilayer structure.

In addition, in the touch display device according to embodiments of the present disclosure, the touch panel TSP can be disposed on the encapsulation layer ENCAP.

That is, in the touch display device, a touch sensor structure, including the plurality of touch electrodes TE, of the touch panel TSP can be disposed on the encapsulation layer ENCAP.

In the touch sensing, the touch driving signal can be applied to the touch electrodes TE, or the touch-sensing signal can be detected from the touch electrodes TE. Then, in the touch sensing, a potential difference can be produced between a touch electrode TE and a cathode disposed on both sides of the encapsulation layer ENCAP, thereby generating unnecessary parasitic capacitance. Since such parasitic capacitance can reduce touch sensitivity, the distance between the touch electrode TE and the cathode can be designed to be a predetermined value or selected value (e.g., 1 μm) or more in consideration of the thickness of the panel, a panel fabrication process, display performance, and the like in order to reduce the parasitic capacitance. In this regard, for example, the thickness of the encapsulation layer ENCAP can be designed to be 1 μm or more.

Figure 4:
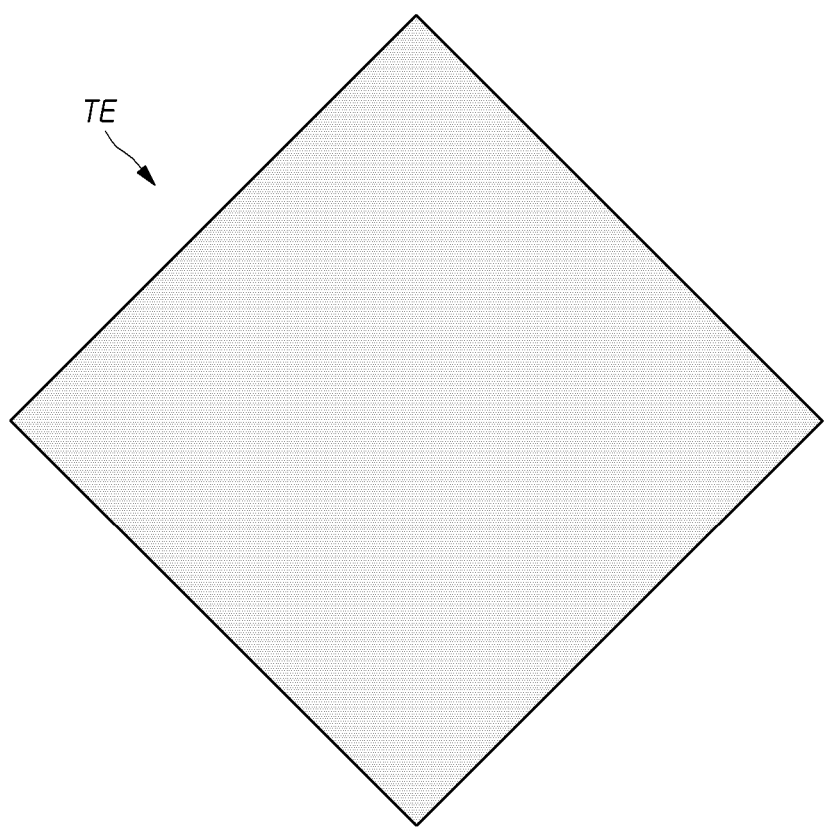
FIGS. 4 and 5 are diagrams illustrating types of touch electrodes disposed in a display panel according to embodiments of the present disclosure.
Figure 5:
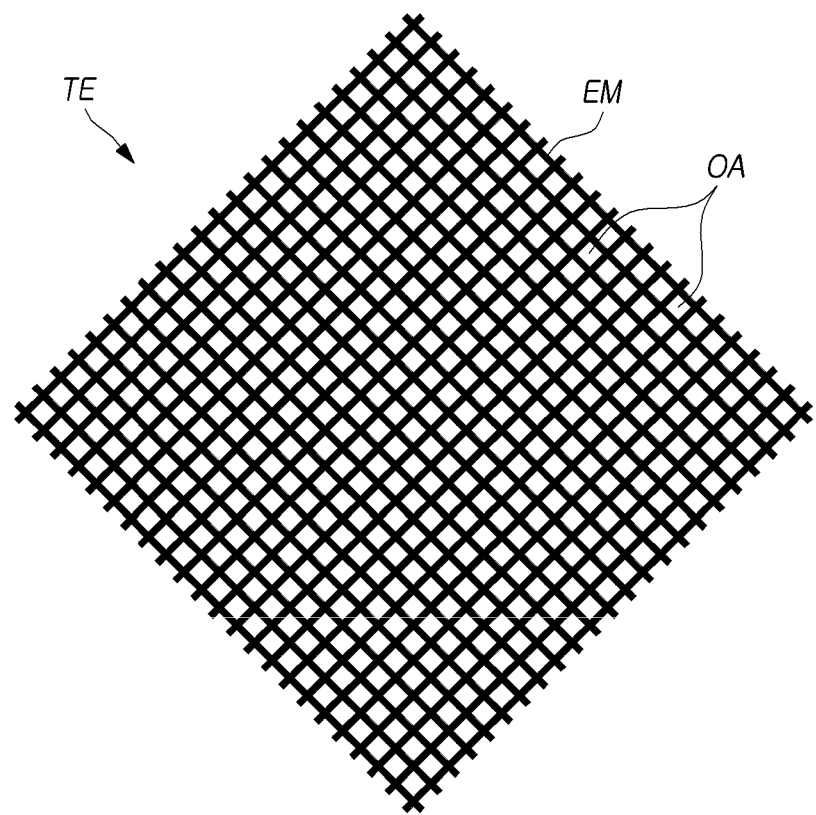

FIGS. 4 and 5 are diagrams illustrating types of touch electrodes TE disposed in the display panel DISP according to embodiments of the present disclosure.

As illustrated in FIG. 4, each of the touch electrodes TE disposed in the display panel DISP can be a plate-shaped electrode metal without an open area. In this case, each of the touch electrodes TE can be a transparent electrode. That is, each of the touch electrodes TE can be made of a transparent electrode material such that light emitted by the plurality of subpixels SP disposed below the touch electrodes TE can pass through the touch electrodes TE.

Alternatively, as illustrated in FIG. 5, each of the touch electrodes TE disposed in the display panel DISP can be an electrode metal EM in the shape of a patterned mesh having two or more open areas OA.

The electrode metal EM is a portion substantially corresponding to the touch electrode TE and is a portion to which the touch driving signal is applied or from which the touch-sensing signal is detected.

As illustrated in FIG. 5, in a case in which each of the touch electrodes TE is the electrode metal EM in the shape of a patterned mesh, two or more open areas OA can be present in the area of the touch electrode TE.

Each of the plurality of open areas OA provided in each of the touch electrodes TE can correspond to the emitting area of one or more subpixels SP. That is, the plurality of open areas OA are passages allowing light emitted from the plurality of subpixels SP located therebelow to pass upward therethrough. Hereinafter, for the sake of brevity, each of the touch electrodes TE will be described as a mesh-shaped electrode metal EM as an example.

The electrode metal EM corresponding to each of the touch electrodes TE can be located on a bank disposed in an area, except for the emitting area of two or more subpixels SP.

In addition, a method of fabricating a plurality of touch electrode TE can comprise making a mesh-shaped electrode metal EM having a wider area and then cutting the electrode metal EM to be made as a predetermined pattern or selected pattern, such that portions of the electrode metal EM are electrically separated from each other, thereby fabricating a plurality of touch electrodes TE.

The outline of the touch electrode TE can have a rectangular shape, such as a diamond or a rhombus shape, as illustrated in FIGS. 4 and 5, or a variety of other shapes, such as a triangle, a pentagon, or a hexagon.

Figure 6:
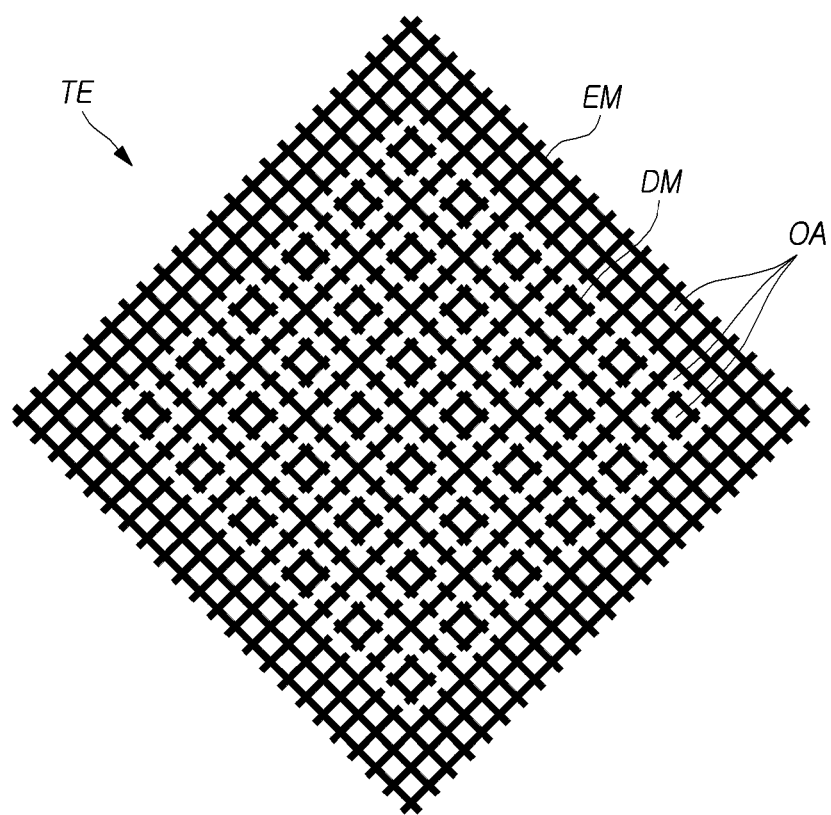
FIG. 6 is a diagram illustrating the mesh-shaped touch electrode illustrated in FIG. 5.

FIG. 6 is a diagram illustrating the mesh-shaped touch electrode TE illustrated in FIG. 5.

Referring to FIG. 6, in the area of each of the touch electrodes TE, one or more dummy metals DM disconnected from the mesh-shaped electrode metal EM can be provided.

The electrode metal EM is a portion substantially corresponding to the touch electrode TE and is a portion to which the touch driving signal is applied or from which the touch-sensing signal is detected. In contrast, the dummy metals DM are portions to which the touch driving signal is not applied and from which the touch-sensing signal is not detected, although the dummy metals DM are portions located in the area of the touch electrode TE. That is, the dummy metals DM can be electrically floating metals.

Thus, the electrode metal EM can be electrically connected to the touch driving circuit TDC, but none of the dummy metals DM are electrically connected to the touch driving circuit TDC.

In the area of each of the entire touch electrodes TE, one or more dummy metals DM can be provided while being disconnected from the electrode metals EM. Although FIG. 6 illustrates an example of a structure that the dummy metal DM is disposed on some area in an area of the touch electrode TE, the dummy metal DM can be present on whole area in the area of the touch electrode TE. Furthermore, the touch electrode TE can include the dummy metal DM or may not include the dummy metal DM, according to locations where the touch electrode TE is disposed.

For example, one or more dummy metal DM can be present to be separated from the electrode metal EM only in an area of each of some touch electrode TE of all touch electrodes TE. That is, the dummy metal DM may not be present in an area of some touch electrode TE.

The function of the dummy metals DM is related to a visibility issue. In a case in which only the mesh-shaped electrode metal EM is present in the area of the touch electrode TE without one or more dummy metals DM being present in the area of the touch electrode TE as illustrated in FIG. 5, the outline of the electrode metal EM can appear on the screen, thereby causing a visibility issue.

In contrast, in a case in which one or more dummy metals DM are present in the area of the touch electrode TE as illustrated in FIG. 6, the outline of the electrode metal EM appearing on the screen, e.g., the visibility issue, can be prevented.

In addition, touch sensitivity can be improved by adjusting the magnitude of capacitance according to each of the touch electrodes TE by adjusting the presence or absence or the number (or ratio) of the dummy metals DM of each of the touch electrodes TE.

In addition, specific points of the electrode metal EM provided in the area of a single touch electrode TE can be cut, so that the cut electrode metal EM form dummy metals DM. That is, the electrode metal EM and the dummy metals DM can be made of substantially the same material provided on the same layer.

In addition, the touch display device according to embodiments of the present disclosure can detect a touch on the basis of capacitance generated on the touch electrode TE.

The touch display device according to embodiments of the present disclosure can detect a touch by a capacitance-based touch sensing method, more particularly, mutual capacitance-based touch sensing or self-capacitance-based touch sensing.

In the mutual capacitance-based touch sensing, the plurality of touch electrodes TE can be divided into driving touch electrodes (or transmitting touch electrodes) to which the touch driving signal is applied and sensing touch electrodes (or receiving touch electrodes) detecting the touch sensing signal and generating capacitance together with the driving touch electrodes.

In the mutual capacitance-based touch sensing, the touch-sensing circuit TSC detects a touch and determines touch coordinates on the basis of changes in the capacitance (e.g., mutual capacitance) occurring between the driving touch electrodes and the sensing touch electrodes, depending on the presence or absence of a pointer, such as a finger or a pen.

In the self-capacitance-based touch sensing, each of the touch electrodes TE serves as both a driving touch electrode and a sensing touch electrode. That is, the touch-sensing circuit TSC detects a touch and determines touch coordinates by applying the touch driving signal to one or more touch electrodes TE, detecting the touch-sensing signal through the touch electrode TE to which the touch driving signal is applied, and recognizing changes in the capacitance between the pointer, such as a finger or a pen, and the touch electrode TE, on the basis of the detected touch-sensing signal. Accordingly, in the self-capacitance-based touch sensing, there is no difference between the driving touch electrodes and the sensing touch electrodes.

As described above, the touch display device according to embodiments of the present disclosure can perform the touch sensing by the mutual capacitance-based touch sensing or the self-capacitance-based touch sensing. Hereinafter, for the sake of brevity, the touch display device performing the mutual capacitance-based touch sensing and having a touch sensor structure for the mutual capacitance-based touch sensing will be described as an example.

Figure 7:
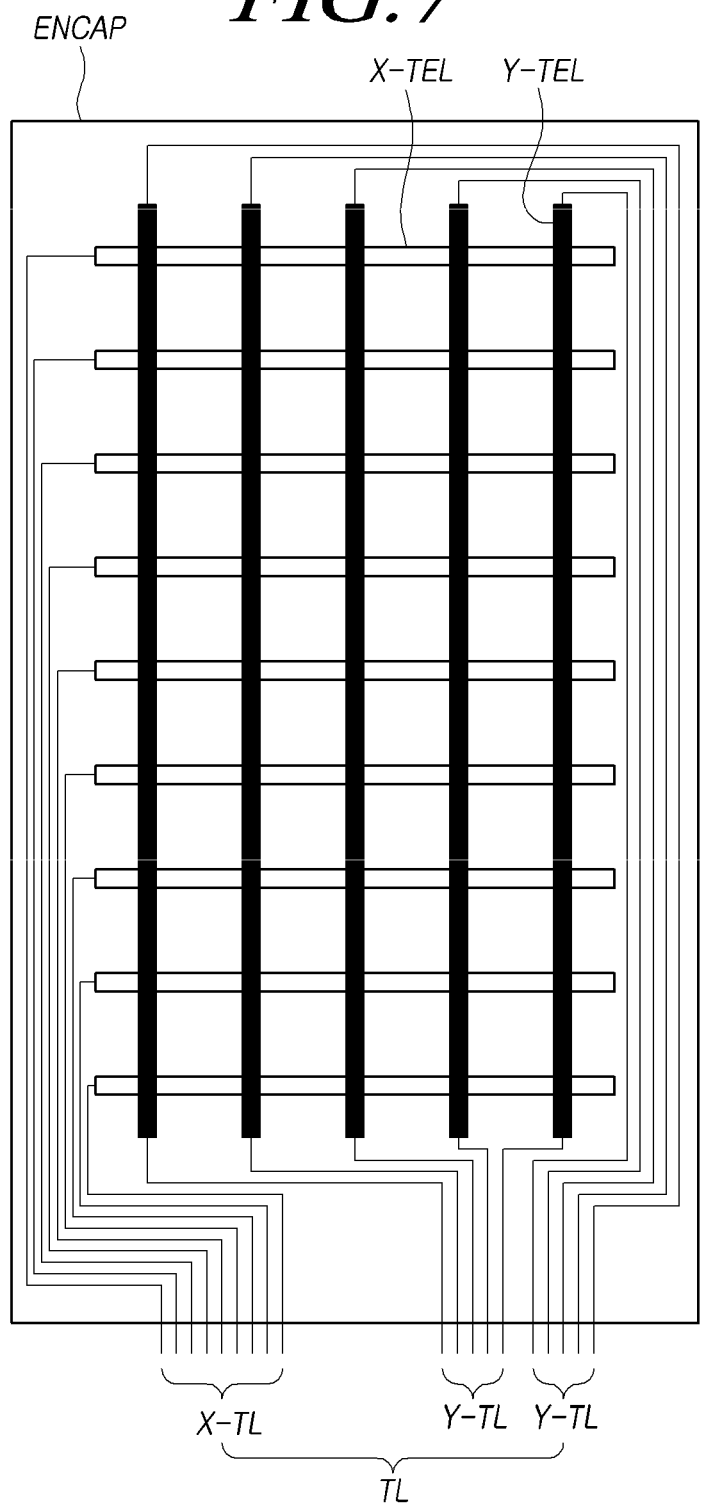
FIG. 7 is a diagram schematically illustrating a touch sensor structure in a display panel according to embodiments of the present disclosure.
Figure 8:
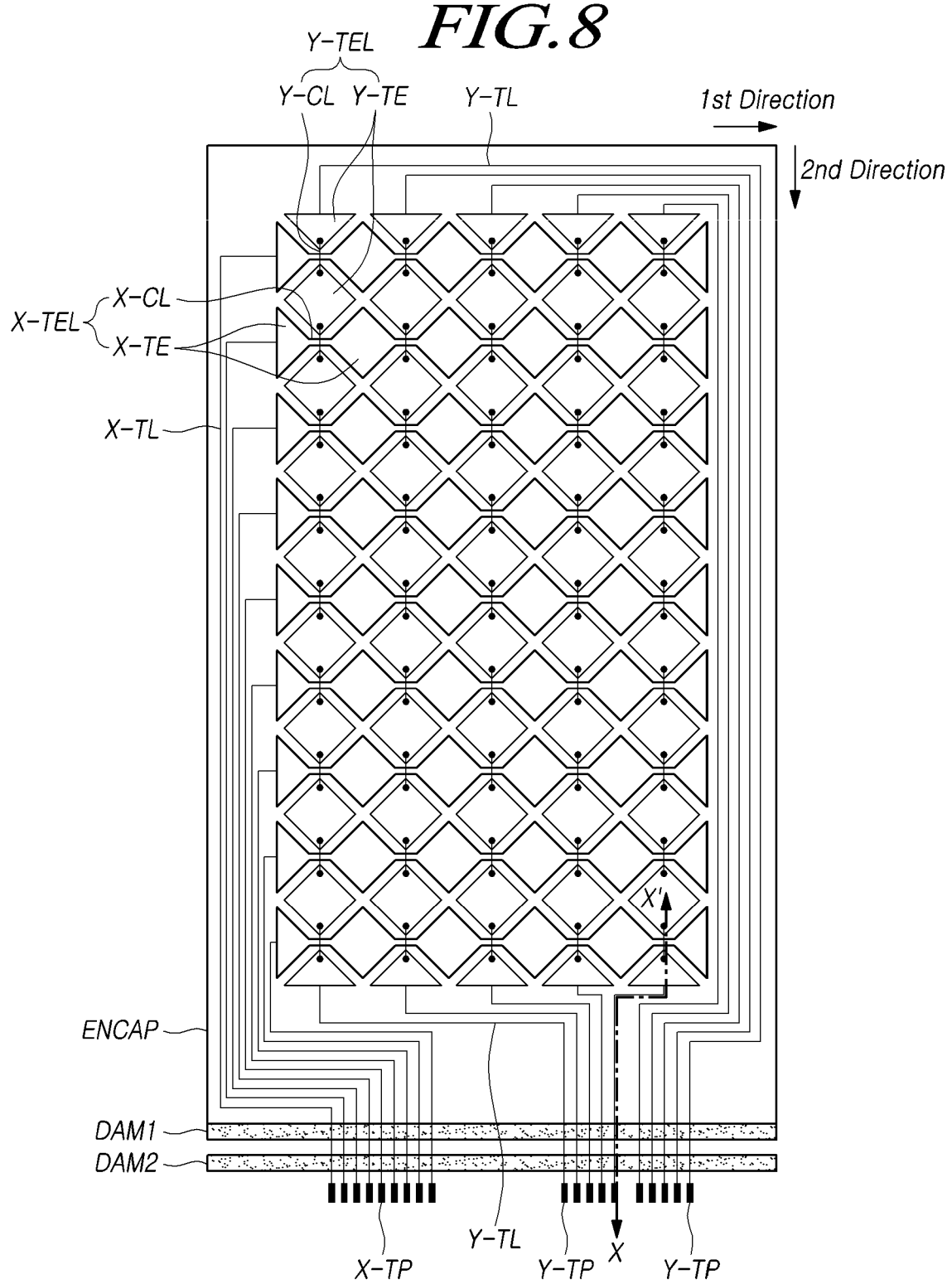
FIG. 8 is a diagram illustrating an example of the touch sensor structure illustrated in FIG. 7.

FIG. 7 is a diagram schematically illustrating a touch sensor structure in the display panel DISP according to embodiments of the present disclosure, and FIG. 8 is a diagram illustrating an example of the touch sensor structure illustrated in FIG. 7.

Referring to FIG. 7, the touch sensor structure for the mutual capacitance-based touch sensing can comprise a plurality of X-touch electrode lines X-TEL and a plurality of Y-touch electrode lines Y-TEL. Here, the plurality of X-touch electrode lines X-TEL and the plurality of Y-touch electrode lines Y-TEL are located on the encapsulation layer ENCAP.

Each of the plurality of X-touch electrode lines X-TEL can be disposed in a first direction, and each of the plurality of Y-touch electrode lines Y-TEL can be disposed in a second direction different from the first direction.

Herein, the first direction and the second direction can be different directions. For example, the first direction can be the X-axis direction, while the second direction can be the Y-axis direction. Alternatively, the first direction can be the Y-axis direction, while the second direction can be the X-axis direction. In addition, the first direction and the second direction can or cannot overlap perpendicularly. In addition, the terms "column" and "row" as used herein are relative terms. The column and the row can be switched depending on the viewing perspective.

Each of the plurality of X-touch electrode lines X-TEL can be comprised of a plurality of X-touch electrodes X-TE electrically connected to each other. Each of the plurality of Y-touch electrode lines Y-TEL can be comprised of a plurality of Y-touch electrodes Y-TE electrically connected to each other.

Here, the plurality of X-touch electrodes X-TE and the plurality of Y-touch electrodes Y-TE are electrodes included in the plurality of touch electrodes TE, and have different functions.

For example, the plurality of X-touch electrodes X-TE constituting each of the plurality of X-touch electrode lines X-TEL can be the driving touch electrodes, while the plurality of Y-touch electrodes Y-TE constituting each of the plurality of Y-touch electrode lines Y-TEL can be the sensing touch electrodes. In this case, each of the plurality of X-touch electrode lines X-TEL corresponds to a driving touch electrode lines, and each of the plurality of Y-touch electrode lines Y-TEL corresponds to a sensing touch electrode line.

Alternatively, the plurality of X-touch electrodes X-TE constituting each of the plurality of X-touch electrode lines X-TEL can be the sensing touch electrodes, while the plurality of Y-touch electrodes Y-TE constituting each of the plurality of Y-touch electrode lines Y-TEL can be the driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal TSM for the touch sensing can comprise a plurality of touch routing lines TL in addition to the plurality of X-touch electrode lines X-TEL and the plurality of Y-touch electrode lines Y-TEL.

The plurality of touch routing lines TL can comprise one or more X-touch routing lines X-TL connected to the plurality of X-touch electrode lines X-TEL, respectively, and one or more Y-touch routing lines Y-TL connected to the plurality of Y-touch electrode lines Y-TEL, respectively.

Referring to FIG. 8, each of the plurality of X-touch electrode lines X-TEL can comprise a plurality of X-touch electrodes X-TE disposed in the same row (or column) and one or more X-touch electrode connecting lines X-CL electrically connecting the plurality of X-touch electrodes X-TE. Here, the X-touch electrode connecting lines X-CL respectively connecting two adjacent X-touch electrodes X-TE can be metals integrated with the two adjacent X-touch electrodes X-TE (see FIG. 8) or metals connected to the two adjacent X-touch electrodes X-TE via contact holes.

Each of the plurality of Y-touch electrode lines Y-TEL can comprise a plurality of Y-touch electrodes Y-TE disposed in the same column (or row) and one or more Y-touch electrode connecting lines Y-CL electrically connecting the plurality of Y-touch electrodes Y-TE. Here, the Y-touch electrode connecting lines Y-CL respectively connecting two adjacent Y-touch electrodes Y-TE can be metals integrated with the two adjacent Y-touch electrodes Y-TE or metals connected to the two adjacent Y-touch electrodes Y-TE via contact holes (see FIG. 8).

In areas in which the X-touch electrode lines X-TEL overlap the Y-touch electrode lines Y-TEL (e.g., touch electrode line overlapping areas), the X-touch electrode connecting lines X-CL can overlap the Y-touch electrode connecting lines Y-CL.

In one embodiment, the X-touch electrode connecting lines X-CL overlap the Y-touch electrode connecting lines Y-CL in the touch electrode line overlapping areas as described above, and the X-touch electrode connecting lines X-CL are located on a layer different from that of the Y-touch electrode connecting lines Y-CL.

Accordingly, the plurality of X-touch electrodes X-TE, the plurality of X-touch electrode connecting lines X-CL, the plurality of Y-touch electrodes Y-TE, and the plurality of Y-touch electrode connecting lines Y-CL can be located on two or more layers, such that the plurality of X-touch electrode lines X-TEL overlap the plurality of Y-touch electrode lines Y-TEL.

Referring to FIG. 8, each of the plurality of X-touch electrode lines X-TEL is electrically connected to a corresponding X-touch pad X-TP through one or more X-touch routing lines X-TL. That is, the outermost X-touch electrode X-TE among the plurality of X-touch electrodes X-TE included in a single X-touch electrode line X-TEL is electrically connected to a corresponding X-touch pad X-TP via the X-touch routing line X-TL.

Each of the plurality of Y-touch electrode lines Y-TEL is electrically connected to corresponding Y-touch pads Y-TP through one or more Y-touch routing lines Y-TL. That is, the outermost Y-touch electrodes Y-TE among the plurality of Y-touch electrodes Y-TE included in a single Y-touch electrode line Y-TEL is electrically connected to the corresponding Y-touch pads Y-TP through the Y-touch routing lines Y-TL.

In addition, as illustrated in FIG. 8, the plurality of X-touch electrode lines X-TEL and the plurality of Y-touch electrode lines Y-TEL can be disposed on the encapsulation layer ENCAP. That is, the plurality of X-touch electrodes X-TE, constituting the plurality of X-touch electrode lines X-TEL, and the plurality of X-touch electrode connecting lines X-CL can be disposed on the encapsulation layer ENCAP. The plurality of Y-touch electrodes Y-TE, constituting the plurality of Y-touch electrode lines Y-TEL, and the plurality of Y-touch electrode connecting lines Y-CL can be disposed on the encapsulation layer ENCAP.

In addition, as illustrated in FIG. 8, the plurality of X-touch routing lines X-TL electrically connected to the plurality of X-touch electrode lines X-TEL can be disposed on the encapsulation layer ENCAP and extend to a location in which the encapsulation layer ENCAP is not provided, thereby being electrically connected to a plurality of X-touch pads X-TP, respectively. The plurality of Y-touch routing lines Y-TL electrically connected to the plurality of Y-touch electrode lines Y-TEL can be disposed on the encapsulation layer ENCAP and extend to a location in which encapsulation layer ENCAP is not provided, thereby being electrically connected to a plurality of Y-touch pads Y-TP, respectively. Here, the encapsulation layer ENCAP can be located in the active area AA and, in some cases, can expand to the non-active area NA.

In addition, as described above, a dam area DA can be provided at the boundary between the active area AA and the non-active area NA or in the non-active area NA at the periphery of the active area AA in order to prevent a layer (e.g., an encapsulation in the OLED display panel) in the active area AA from collapsing.

As illustrated in FIG. 8, for example, a first dam DAM1 and a second dam DAM2 can be disposed in the dam area DA. Here, the second dam DAM2 can be located more outward than the first dam DAM1.

In a manner different from that illustrated in FIG. 8, only the first dam DAM1 can be located in the dam area DA. In some cases, not only the first dam DAM1 and the second dam DAM2 but also one or more additional dam can be disposed in the dam area DA.

Referring to FIG. 8, the encapsulation layer ENCAP can be located on a side of the first dam DAM1 or be located both on a side of and above the first dam DAM1.

Figure 9:
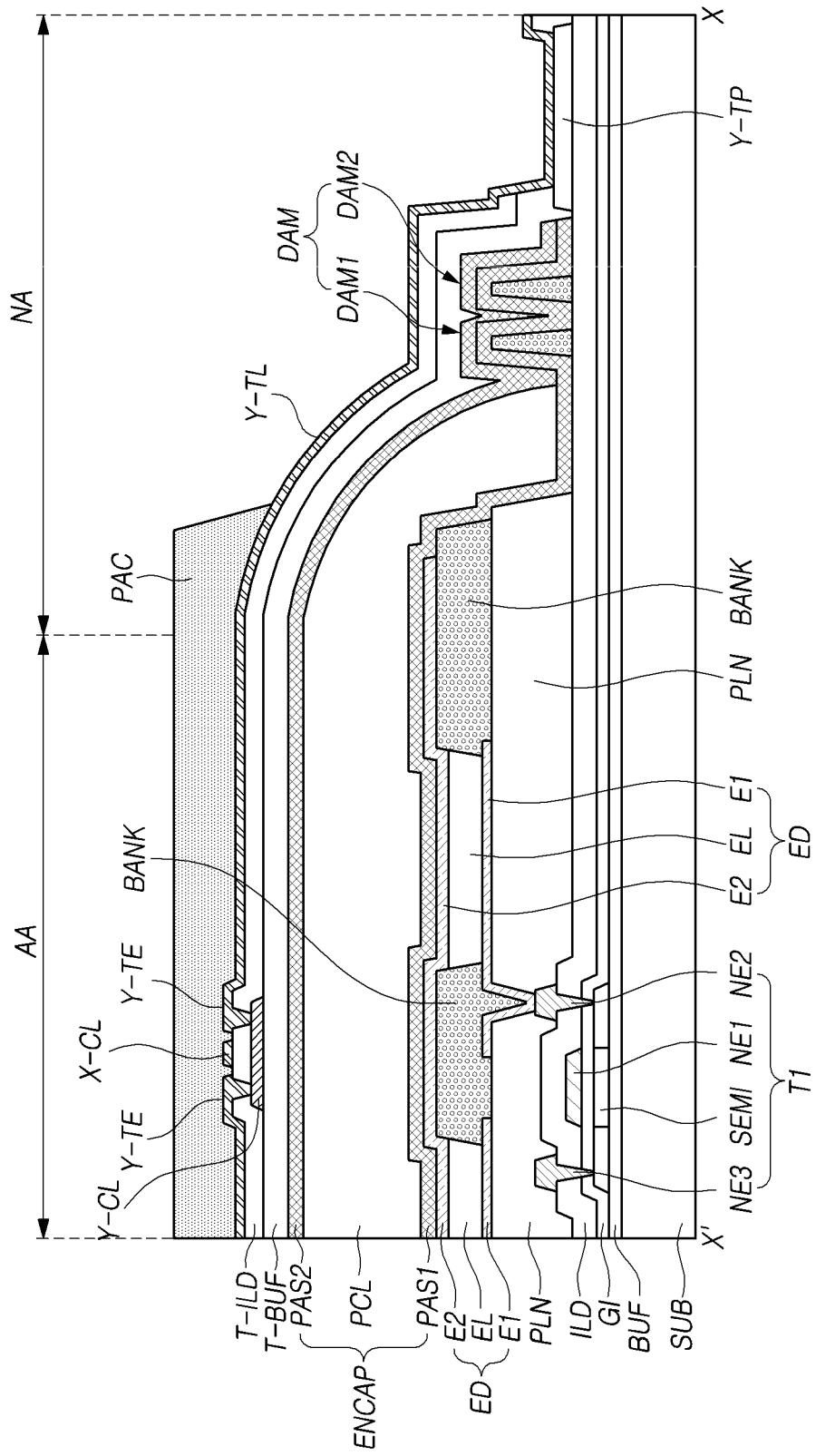
FIG. 9 is a cross-sectional diagram illustrating portions of the display panel according to embodiments of the present disclosure, taken along line X-X' in FIG. 8.

FIG. 9 is a cross-sectional diagram illustrating portions of the display panel DISP according to embodiments of the present disclosure, taken along line X-X' in FIG. 8. In FIG. 9, the touch electrode TE is illustrated in the shape of a plate. However, this is illustrative only, and the touch electrode TE can be mesh shaped. In a case in which the touch electrode TE is mesh shaped, the open areas OA of the touch electrode TE can be located above the emissive areas of subpixels SP.

The first transistor T1, e.g., the driving transistor in each of the subpixels SP in the active area AA, is disposed on the substrate SUB.

The first transistor T1 comprises a first node electrode NE1 corresponding to the gate electrode, a second node electrode NE2 corresponding to a source electrode or a drain electrode, a third node electrode NE3 corresponding to a drain electrode or a source electrode, a semiconductor layer SEMI, and the like.

The first node electrode NE1 and the semiconductor layer SEMI can be located on both sides of a gate insulating film GI to overlap each other. The second node electrode NE2 can be provided on an interlayer insulating film ILD to be in contact with one side of the semiconductor layer SEMI, while the third node electrode NE3 can be provided on the interlayer insulating film ILD to be in contact with the other side of the semiconductor layer SEMI.

The emitting device ED can comprise a first electrode E1 corresponding to an anode (or cathode), an emitting layer EL provided on the first electrode E1, a second electrode E2 corresponding to a cathode (or anode) provided on the emitting layer EL, and the like.

The first electrode E1 is electrically connected to the second node electrode NE2 of the first transistor T1, exposed through a pixel contact hole extending through a planarization layer PLN.

The emitting layer EL is provided on the first electrode E1 in the emitting area provided by banks BANK. The emitting layer EL is provided on the first electrode E1 and is comprised of a hole-related layer, an emissive layer, and an electron-related layer stacked in the stated order or inversely. The second electrode E2 is provided on the side of the emitting layer EL opposite to the first electrode E1.

The encapsulation layer ENCAP prevents external moisture or oxygen from penetrating the emitting device ED vulnerable to external moisture, oxygen, or the like.

The encapsulation layer ENCAP can be a single layer or, as illustrated in FIG. 9, be comprised of a plurality of layers PAS1, PCL, and PAS2.

For example, in a case in which the encapsulation layer ENCAP is comprised of the plurality of layers PAS1, PCL, and PAS2, the encapsulation layer ENCAP can comprise one or more inorganic encapsulation layers PAS1 and PAS2 and one or more organic encapsulation layers PCL. As a specific example, the encapsulation layer ENCAP can have a structure in which the first inorganic encapsulation layer PAS1, the organic encapsulation layer PCL, and the second inorganic encapsulation layer PAS2 are stacked in order.

Here, the organic encapsulation layer PCL can further comprise at least one organic encapsulation layer or at least one inorganic encapsulation layer.

The first inorganic encapsulation layer PAS1 is provided on the substrate SUB, on which the second electrode E2 corresponding to the cathode is provided, so as to be closest to the emitting device ED. The first inorganic encapsulation layer PAS1 is made of an inorganic insulating material, such as silicon nitride (SiNx), silicon oxide (SiOx), silicon oxynitride (SiON), or aluminum oxide ($Al_2O_3$), which can be deposited at a low temperature. Since the first inorganic encapsulation layer PAS1 is deposited in a low-temperature atmosphere, the first inorganic encapsulation layer PAS1 can prevent the emitting layer EL containing an organic material vulnerable to a high-temperature atmosphere from being damaged during deposition processing.

The organic encapsulation layer PCL can be provided in an area smaller than the area of the first inorganic encapsulation layer PAS1. In this case, the organic encapsulation layer PCL can be configured to expose both edges of the first inorganic encapsulation layer PAS1. The organic encapsulation layer PCL can serve as a buffer to reduce stress between the layers caused by bending of the touch display device and serve to enhance planarization performance. The organic encapsulation layer PCL can be made of, for example, an organic insulating material, such as an acrylic resin, an epoxy resin, polyimide, polyethylene, silicon oxycarbon (SiOC).

In addition, in a case in which the organic encapsulation layer PCL is fabricated by inkjet printing, one or more dams DAM can be provided in the dam area DA corresponding to the boundary between the non-active area NA and the active area AA or a portion of the non-active area NA.

For example, as illustrated in FIG. 9, the dam area DA is located between a pad area in the non-active area NA and the active area AA. The pad area refers to a portion of the non-active area NA in which the plurality of X-touch pads X-TP and the plurality of Y-touch pads Y-TP are provided. In the dam area DA, the first dam DAM1 adjacent to the active area AA and the second dam DAM2 adjacent to the pad area can be provided.

The one or more dams DAM disposed in the dam area DA can prevent the organic encapsulation layer PCL in a liquid form from collapsing in the direction of the non-active area NA and penetrating into the pad area when the organic encapsulation layer PCL in the liquid form is dropped to the active area AA.

This effect can be further increased by the provision of the first dam DAM1 and the second dam DAM2 as illustrated in FIG. 9.

At least one of the first dam DAM1 and the second dam DAM2 can have a single layer or multilayer structure. For example, at least one of the first dam DAM1 and the second dam DAM2 can be simultaneously made of substantially the same material as at least one of the banks BANK and spacers (not shown). In this case, a dam structure can be provided without additional mask processing or an increase in cost.

In addition, as illustrated in FIG. 9, at least one of the first dam DAM1 and the second dam DAM2 can have a structure in which at least one of the first inorganic encapsulation layer PAS1 and the second inorganic encapsulation layer PAS2 is stacked on the banks BANK.

In addition, the organic encapsulation layer PCL containing an organic material can be located on an inner side of the first dam DAM1, as illustrated in FIG. 9.

Alternatively, the organic encapsulation layer PCL containing an organic material can be located above at least a portion of the first dam DAM1 and the second dam DAM2. For example, the organic encapsulation layer PCL can be located above the first dam DAM1.

The second inorganic encapsulation layer PAS2 can be provided on the substrate SUB on which the organic encapsulation layer PCL is provided, so as to cover the top surfaces and side surfaces of the organic encapsulation layer PCL and the first inorganic encapsulation layer PAS1. The second inorganic encapsulation layer PAS2 minimizes, reduces or prevents external moisture or oxygen from penetrating the first inorganic encapsulation layer PAS1 or the organic encapsulation layer PCL. The second inorganic encapsulation layer PAS2 is made of, for example, an inorganic insulating material, such as SiNx, SiOx, SiON, or $Al_2O_3$.

A touch buffer film T-BUF can be provided on the encapsulation layer ENCAP. The touch buffer film T-BUF can be located between the touch sensor metal TSM, including the X and Y-touch electrodes X-TE and Y-TE and X and Y-touch electrode connecting lines X-CL and Y-CL, and the second electrode E2 of the emitting device ED.

The touch buffer film T-BUF can be designed to maintain a predetermined minimum distance or selected distance (e.g., 1 μm) or more between the touch sensor metal TSM and the second electrode E2 of the emitting device ED. Accordingly, this can reduce or prevent parasitic capacitance generated between the touch sensor metal TSM and the second electrode E2 of the emitting device ED, thereby preventing touch sensitivity from being reduced by the parasitic capacitance.

Without the touch buffer film T-BUF, the touch sensor metal TSM comprising the X and Y-touch electrodes X-TE and Y-TE and the X and Y-touch electrode connecting lines X-CL and Y-CL can be disposed on the encapsulation layer ENCAP.

In addition, the touch buffer film T-BUF can prevent the emitting layer EL containing the organic material from being penetrated by a chemical agent (e.g., a developing solution or an etching solution) used in fabrication processing of the touch sensor metal TSM disposed on the touch buffer film T-BUF, external moisture, or the like. Accordingly, the touch buffer film T-BUF can prevent the emitting layer EL vulnerable to the chemical agent or moisture from being damaged.

The touch buffer film T-BUF is made of an organic insulating material producible at a low temperature equal to or lower than a predetermined temperature or selected temperature (e.g., 100° C.) and having a low dielectric constant of 1 to 3 in order to prevent the emitting layer EL containing the organic material vulnerable to high temperature from being damaged. For example, the touch buffer film T-BUF can be made of an epoxy-based material or a siloxane-based material. The touch buffer film T-BUF made of an inorganic insulating material and having a planarization performance can prevent the layers PAS1, PCL, and PAS2 included in the encapsulation layer ENCAP from being damaged or the touch sensor metal TSM on the touch buffer film T-BUF from being fractured in response to the bending of the OLED display device.

According to the mutual capacitance-based touch sensor structure, the X-touch electrode lines X-TEL and the Y-touch electrode lines Y-TEL are disposed on the touch buffer film T-BUF, and the X-touch electrode lines X-TEL and the Y-touch electrode lines Y-TEL can be disposed such that the X-touch electrode lines X-TEL overlap the Y-touch electrode lines Y-TEL.

The Y-touch electrode lines Y-TEL can comprise the plurality of Y-touch electrodes Y-TE and the plurality of Y-touch electrode connecting lines Y-CL electrically connecting the plurality of Y-touch electrodes Y-TE.

As illustrated in FIG. 9, the plurality of Y-touch electrodes Y-TE and the plurality of Y-touch electrode connecting lines Y-CL can be disposed on different layers, on both sides of a touch insulating film T-ILD.

The plurality of Y-touch electrodes Y-TE can be spaced apart from each other by predetermined distances or selected distances in the Y-axis direction. Each of the plurality of Y-touch electrodes Y-TE can be electrically connected to the other adjacent Y-touch electrodes Y-TE through the Y-touch electrode connecting lines Y-CL in the Y-axis direction.

The Y-touch electrode connecting lines Y-CL can be provided on the touch buffer film T-BUF and exposed through touch contact holes extending through the touch insulating film T-ILD to be electrically connected to the two adjacent Y-touch electrodes Y-TE in the Y-axis direction.

The Y-touch electrode connecting lines Y-CL can be disposed to overlap the banks BANK. Accordingly, the aperture ratio can be prevented from being decreased by the Y-touch electrode connecting lines Y-CL.

The X-touch electrode lines X-TEL can comprise the plurality of X-touch electrodes X-TE and the plurality of X-touch electrode connecting lines X-CL electrically connecting the plurality of X-touch electrodes X-TE. The plurality of X-touch electrodes X-TE and the plurality of X-touch electrode connecting line X-CL can be disposed on different layers, on both sides of the touch insulating film T-ILD.

The plurality of X-touch electrodes X-TE can be disposed on the touch insulating film T-ILD, spaced apart from each other by predetermined distances or selected distances in the X-axis direction. Each of the plurality of X-touch electrodes X-TE can be electrically connected to the adjacent other X-touch electrodes X-TE through the X-touch electrode connecting lines X-CL in the X-axis direction.

The X-touch electrode connecting lines X-CL can be disposed on substantially the same plane as the X-touch electrodes X-TE to be electrically connected to the two adjacent X-touch electrodes X-TE in the X-axis direction without separate contact holes or be integrated with the two adjacent X-touch electrodes X-TE in the X-axis direction.

The X-touch electrode connecting lines X-CL can be disposed to overlap the banks BANK. Accordingly, the aperture ratio can be prevented from being decreased by the X-touch electrode connecting lines X-CL.

In addition, the Y-touch electrode lines Y-TEL can be electrically connected to the touch driving circuit TDC through the Y-touch routing lines Y-TL and the Y-touch pads Y-TP. In the same manner, the X-touch electrode lines X-TEL can be electrically connected to the touch driving circuit TDC through the X-touch routing lines X-TL and the X-touch pads X-TP.

A pad cover electrode covering the X-touch pads X-TP and the Y-touch pads Y-TP can be further disposed.

The X-touch pads X-TP can be provided separately from the X-touch routing lines X-TL or be provided as extensions of the X-touch routing lines X-TL. The Y-touch pads Y-TP can be provided separately from the Y-touch routing lines Y-TL or be provided as extensions of the Y-touch routing lines Y-TL.

In a case in which the X-touch pads X-TP are extensions of the X-touch routing lines X-TL and the Y-touch pads Y-TP are extensions of the Y-touch routing lines Y-TL, the X-touch pads X-TP, the X-touch routing lines X-TL, the Y-touch pads Y-TP, and the Y-touch routing lines Y-TL can comprise substantially the same material, e.g., a first conductive material. The first conductive material can have a single or multilayer structure made of a metal, such as Al, Ti, Cu, or Mo, having high corrosion resistance, high acid resistance, and high conductivity.

For example, each of the X-touch pads X-TP, the X-touch routing lines X-TL, the Y-touch pads Y-TP, and the Y-touch routing lines Y-TL comprised of the first conductive material can have a three-layer structure, such as Ti/Al/Ti or Mo/Al/Mo.

The pad cover electrode capable of covering the X-touch pads X-TP and the Y-touch pads Y-TP can comprised substantially the same material as the X and Y-touch electrodes X-TE and Y-TE, e.g., a second conductive material. The second conductive material can be a transparent conductive material, such as indium tin oxide (ITO) or indium zinc oxide (IZO), having high corrosion resistance and acid resistance. The pad cover electrodes can be provided to be exposed from the touch buffer film T-BUF so as to be bonded to the touch driving circuit TDC or to a circuit film on which the touch driving circuit TDC is mounted.

The touch buffer film T-BUF can be provided to cover the touch sensor metal TSM so as to prevent the touch sensor metal TSM from being corroded by external moisture. For example, the touch buffer film T-BUF can be made of an organic insulating material or be provided as a circular polarizer or a film made of an epoxy or acrylic material. The touch buffer film T-BUF may not be provided on the encapsulation layer ENCAP. That is, the touch buffer film T-BUF may be an optional component.

The Y-touch routing lines Y-TL can be electrically connected to the Y-touch electrodes Y-TE via touch routing line contact holes or be integrated with the Y-touch electrodes Y-TE.

Each of the Y-touch routing lines Y-TL can extend to the non-active area NA, past the top and side portions of the encapsulation layer ENCAP and the dams DAM, so as to be electrically connected to the Y-touch pads Y-TP. Accordingly, the Y-touch routing lines Y-TL can be electrically connected to the touch driving circuit TDC through the Y-touch pads Y-TP.

The Y-touch routing lines Y-TL can deliver the touch-sensing signal from the Y-touch electrodes Y-TE to the touch driving circuit TDC or deliver the touch driving signal, received from the touch driving circuit TDC, to the Y-touch electrodes Y-TE.

The X-touch routing lines X-TL can be electrically connected to the X-touch electrodes X-TE via the touch routing line contact holes or be integrated with the X-touch electrodes X-TE.

The X-touch routing lines X-TL can extend to the non-active area NA, past the top and side portions of the encapsulation layer ENCAP and the dams DAM, so as to be electrically connected to the X-touch pads Y-TP. Accordingly, the X-touch routing lines X-TL can be electrically connected to the touch driving circuit TDC through the X-touch pads X-TP.

The X-touch routing lines X-TL can deliver the touch driving signal, received from the touch driving circuit TDC, to the X-touch electrodes X-TE or deliver touch-sensing signal from the X-touch electrodes X-TE to the touch driving circuit TDC.

The arrangement of the X-touch routing lines X-TL and the Y-touch routing lines Y-TL can be modified variously depending on the design specification of the panel.

A touch protective film PAC can be disposed on the X-touch electrodes X-TE and the Y-touch electrodes Y-TE. The touch protective film PAC can extend to an area in front of or behind the dams DAM so as to be disposed on the X-touch routing lines X-TL and the Y-touch routing lines Y-TL.

The cross-sectional diagram of FIG. 9 is conceptual illustration of the structure. The positions, thicknesses, or widths of the patterns (e.g., various layers or electrodes) can vary depending on the direction or position of view, the structures for connecting the patterns can be modified, additional layers other than the plurality of illustrated layers can be further provided, and some of the plurality of illustrated layers can be omitted or integrated. For example, the width of the banks BANK can be narrower than that illustrated in the drawings, and the height of the dams DAM can be lower or higher than that illustrated in the drawings. In addition, the cross-sectional diagram of FIG. 9 illustrates a structure in which the touch electrode TE, the touch routing lines TL, and the like are disposed on the entirety of the subpixels SP in order to illustrate a structure connected to the touch pads TP along inclines of the touch routing lines TL and the encapsulation layer ENCAP. However, in a case in which the touch electrode TE or the like is mesh-shaped as described above, the open areas OA of the touch electrode TE can be located above the emitting areas of the subpixels SP. In addition, a color filter CF (see FIGS. 10 and 11) can be further disposed on the encapsulation layer ENCAP. The color filter CF can be located on the touch electrode TE or between the encapsulation layer ENCAP and the touch electrode TE.

Furthermore, in the case that the non-active area NA of the display panel DISP is bent, an area where the display panel DISP is bent can be present between the touch pad TP and the dam DAM. The touch pad TP can be located between the area where the display panel DISP is bent and an outer boundary of the display panel DISP on the non-active area NA of the display panel DISP.

Figure 10:
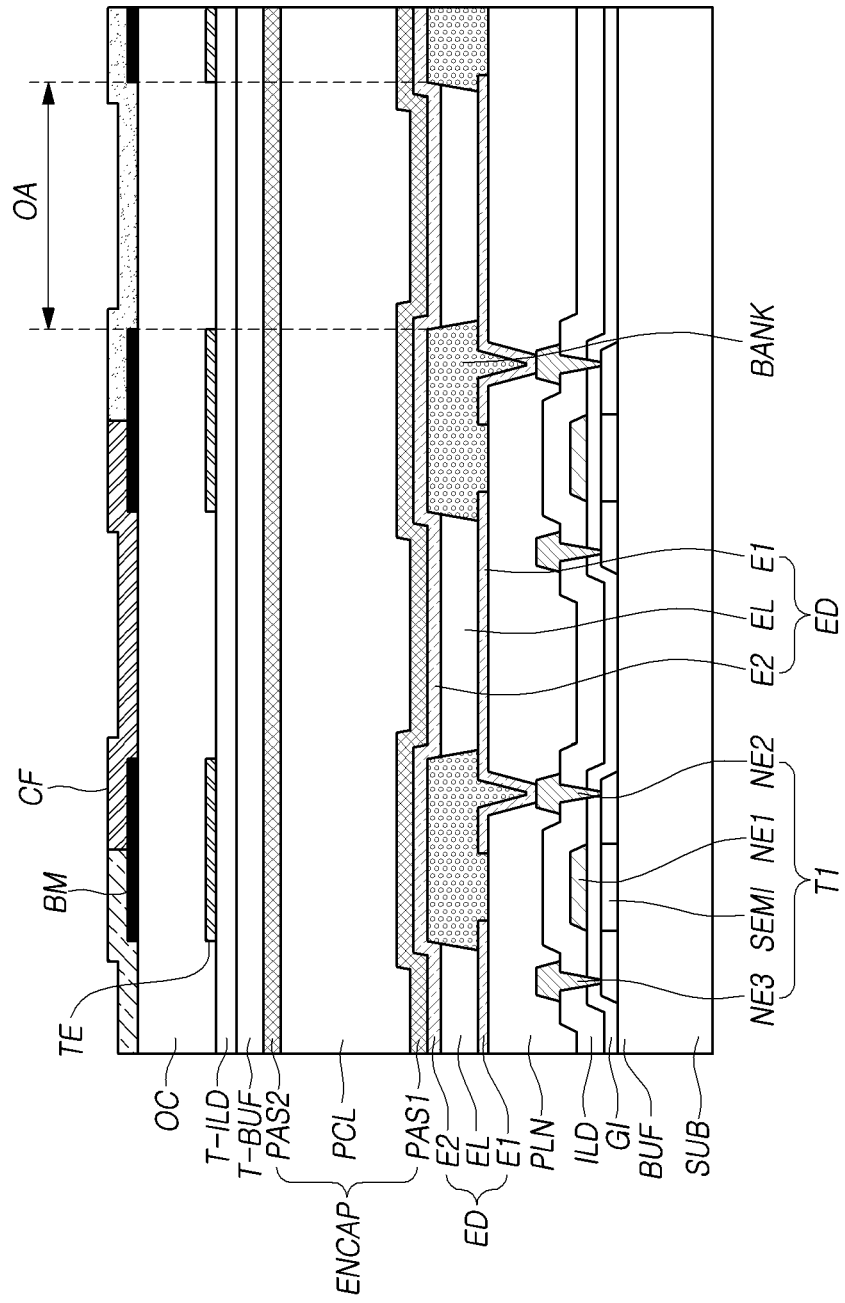
FIGS. 10 and 11 are diagrams illustrating a cross-sectional structure of a display panel according to embodiments of the present disclosure, including a color filter.
Figure 11:
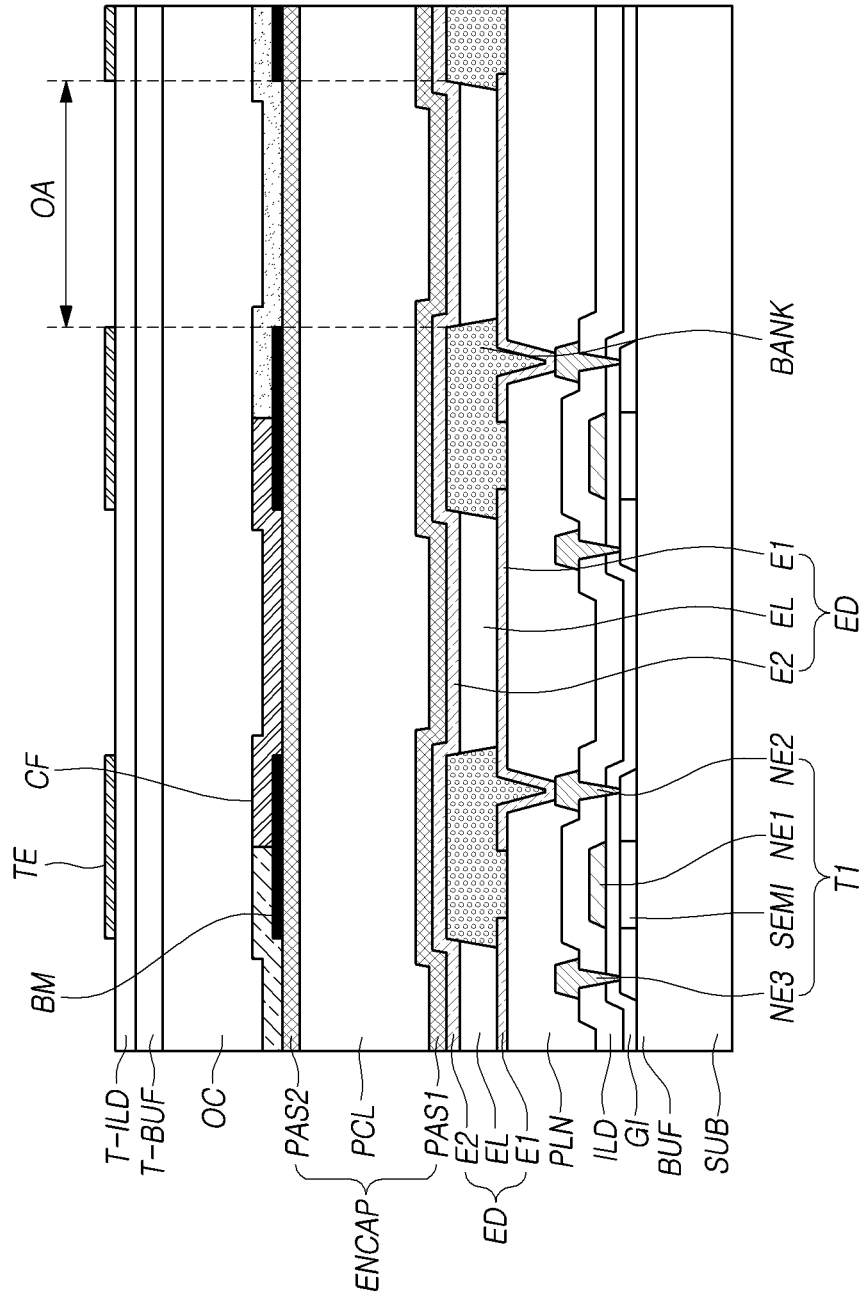

FIGS. 10 and 11 are diagrams illustrating a cross-sectional structure of the display panel DISP according to embodiments of the present disclosure, including the color filter CF.

Referring to FIGS. 10 and 11, in a case in which the touch panel TSP is disposed within the display panel DISP and the display panel DISP is provided as an OLED display panel, the touch panel TSP can be located on the encapsulation layer ENCAP in the display panel DISP. That is, the touch sensor metals TSM, such as the plurality of touch electrodes TE and the plurality of touch routing lines TL, can be located on the encapsulation layer ENCAP in the display panel DISP.

The touch electrode TE being provided on the encapsulation layer ENCAP as described above can be made as the touch electrode TE without significantly influencing the display performance or the formation of a display-related layer.

Referring to FIGS. 10 and 11, the second electrode E2 that can be the cathode of the OLED can be located below the encapsulation layer ENCAP.

The thickness T of the encapsulation layer ENCAP can be, for example, 1 µm or more.

Since the thickness of the encapsulation layer ENCAP is designed to be 1 µm or more as described above, parasitic capacitance generated between the second electrode E2 of the OLED and the touch electrodes TE can be reduced, thereby preventing touch sensitivity from being reduced by the parasitic capacitance.

As described above, each of the plurality of touch electrodes TE is patterned in the shape of a mesh, in which the electrode metal EM has two or more open areas OA. Each of the two or more open areas OA can correspond to one or more subpixels or the emitting areas thereof when viewed in a vertical direction.

As described above, the electrode metal EM of the touch electrode TE can be patterned such that the emitting area of one or more subpixels SP is provided in a position corresponding to each of the two or more open areas OA present in the area of the touch electrode TE when viewed in a plan view. Accordingly, the luminous efficiency of the display panel DISP can be improved.

As illustrated in FIGS. 10 and 11, a black matrix BM can be provided in the display panel DISP. The color filter CF can be further provided in the display panel DISP.

The position of the black matrix BM can correspond to the position of the electrode metal EM of the touch electrode TE.

The positions of the plurality of color filters CF correspond to the positions of the plurality of touch electrodes TE or the position of the plurality of open areas OA in the electrode metal EM constituting the plurality of touch electrodes TE.

Since the plurality of color filters CF are located in positions corresponding to the plurality of open areas OA as described above, the luminous performance of the display panel DISP can be improved.

The vertical positional relationship between the plurality of color filters CF and the plurality of touch electrodes TE will be described as follows.

As illustrated in FIG. 10, the plurality of color filters CF and the black matrix BM can be located on the plurality of touch electrodes TE.

In this case, the plurality of color filters CF and the black matrix BM can be located on the overcoat layer OC disposed on the plurality of touch electrodes TE. Here, the overcoat layer OC can be the same layer as or a different layer from the touch protective film PAC illustrated in FIG. 9.

Alternatively, as illustrated in FIG. 11, the plurality of color filters CF and the black matrix BM can be located below the plurality of touch electrodes TE.

In this case, the plurality of touch electrodes TE can be located on the overcoat layer OC on the plurality of color filters CF and the black matrix BM. The overcoat layer OC can be the same layer as or a different layer from the touch buffer film T-BUF or the touch insulating film T-ILD illustrated in FIG. 9. Alternatively, the touch buffer film T-BUF or the touch insulating film T-ILD can be disposed in a manner separate from the overcoat layer OC.

Due to the vertical positional relationship between the touch electrode TE and a display driving configuration being adjusted as described above, a touch sensing configuration can be disposed without degrading the display performance.

Meanwhile, in the non-active area NA of the display panel DISP, there may be disposed a plurality of touch routing lines TL electrically connecting between the touch electrode line TEL and the touch driving circuit TDC.

The touch routing line TL may be located on the encapsulation layer ENCAP in the non-active area NA.

Since the encapsulation layer ENCAP may gradually decrease in thickness in the non-active area NA, the touch routing line TL may be located on an inclined portion of the encapsulation layer ENCAP in the non-active area NA.

Figure 12:
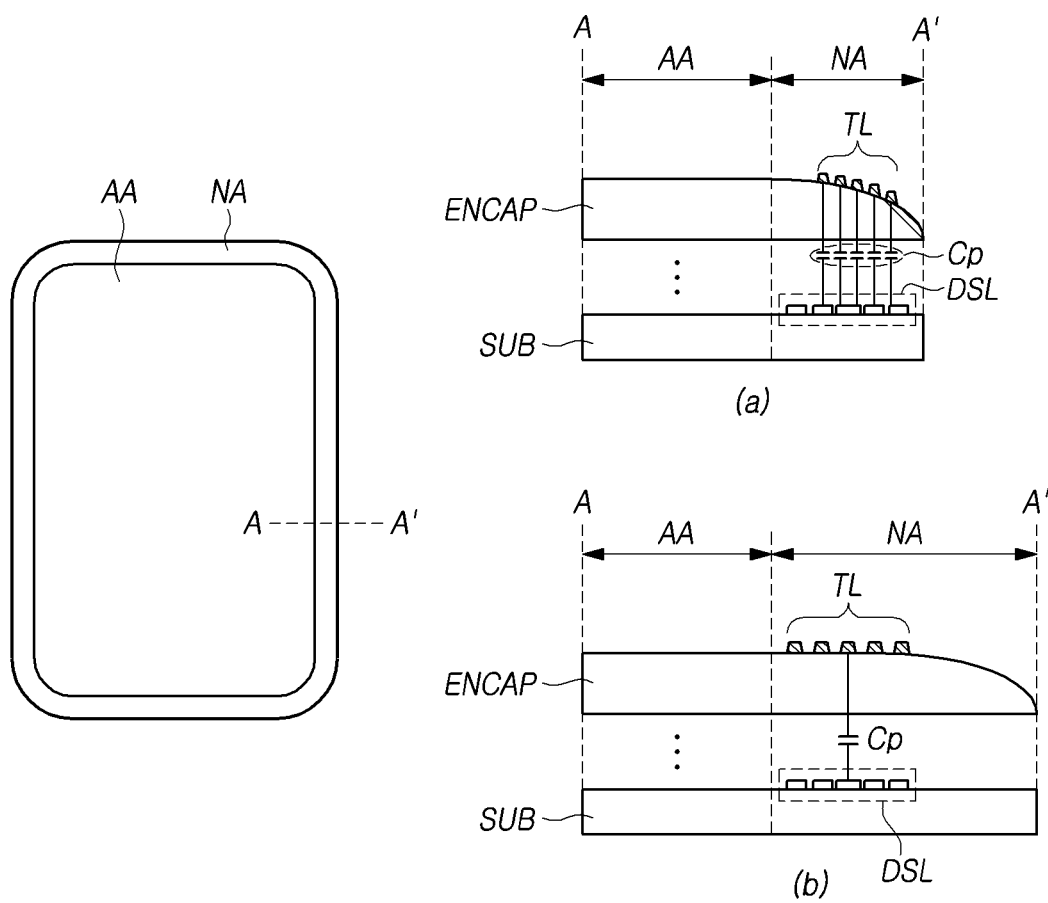
FIG. 12 is a diagram illustrating an example of a structure in which a touch routing line is disposed in a non-active area of a display panel according to embodiments of the present disclosure.

FIG. 12 is a diagram illustrating an example of a structure in which a touch routing line TL is disposed in a non-active area NA of a display panel DISP according to embodiments of the present disclosure.

Referring to FIG. 12, as illustrated in (a), the touch routing line TL can be disposed on an inclined portion of the encapsulation layer ENCAP. A display signal line DSL for supplying a signal or voltage for driving a display may be disposed under the encapsulation layer ENCAP.

A parasitic capacitance Cp may be formed between the touch routing line TL located on the encapsulation layer ENCAP and the display signal line DSL located under the encapsulation layer ENCAP. Since such parasitic capacitance may act as noise of a touch sensing signal detected through the touch routing line TL, touch sensing accuracy may deteriorates.

In particular, since the distance between the touch routing line TL and the display signal line DSL disposed in a portion having a small thickness of the encapsulation layer ENCAP is small, the parasitic capacitance may be the largest.

In addition, the distance between the touch routing line TL and the display signal line DSL is different depending on the location, so that parasitic capacitance deviation may be generated. In this case, there may be difficult to implement a structure capable of accurate touch sensing due to the parasitic capacitance deviation.

In this case, as the example illustrated in (b), the touch routing line TL can be disposed in a planarized area of the encapsulation layer ENCAP. However, in this case, the non-active area NA of the display panel DISP may increase due to an increase in the area where the encapsulation layer ENCAP is disposed.

Embodiments of the present disclosure can provide a solution for improving the performance of touch sensing by reducing the parasitic capacitance between the touch routing line TL and the display signal line DSL without increasing the non-active area NA.

Figure 13:
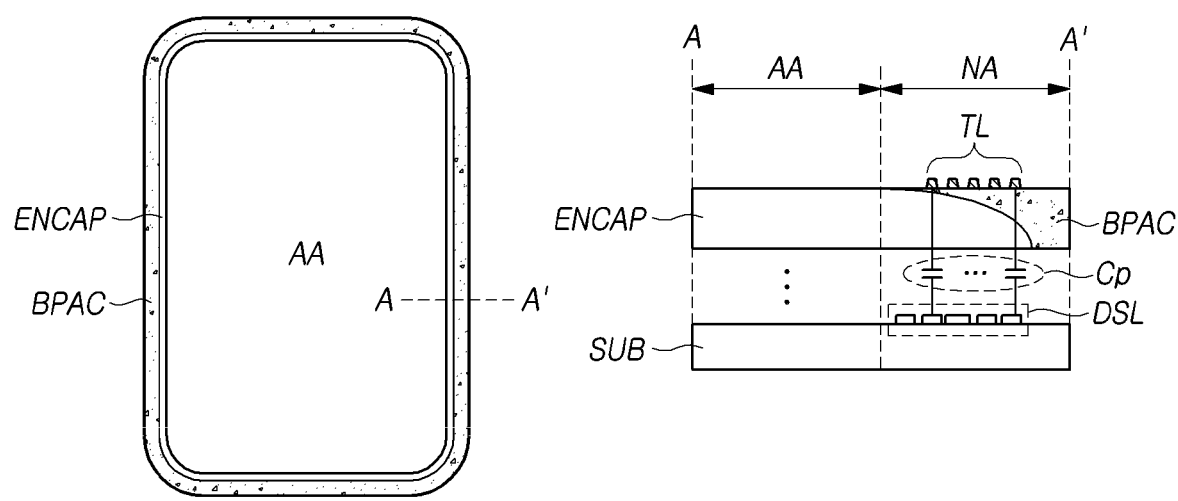
FIG. 13 is a diagram illustrating another example of a structure in which a touch routing line is disposed in a non-active area of a display panel according to embodiments of the present disclosure.

FIG. 13 is a diagram illustrating another example of a structure in which a touch routing line TL is disposed in a non-active area NA of a display panel DISP according to embodiments of the present disclosure.

Referring to FIG. 13, a touch planarization film BPAC can be disposed on at least a partial area on an inclined portion of the encapsulation layer ENCAP in the non-active area NA of the display panel DISP.

The touch planarization film BPAC, for example, can be disposed on four edge areas of the display panel DISP. The touch planarization film BPAC can be formed of, for example, an organic material.

The touch routing line TL can be disposed on the touch planarization film BPAC.

Accordingly, as the touch planarization film BPAC is disposed on the inclined portion of the encapsulation layer ENCAP, it is possible to prevent the distance between the touch routing line TL and the display signal line DSL from getting closer.

In addition, as the touch routing line TL is disposed on the touch planarization film BPAC, a distance between the touch routing line TL and the display signal line DSL can increase.

There can be reduced the parasitic capacitance between the touch routing line TL and the display signal line DSL due to an increase in the distance between the touch routing line TL and the display signal line DSL.

In addition, the deviation of the parasitic capacitance between the touch routing line TL and the display signal line DSL also can be reduced.

There can be reduced a difference in a parasitic capacitance between the touch routing line TL located closest to the active area AA and the display signal line DSL, and a parasitic capacitance between the touch routing line TL located farthest from the active area AA and the display signal line DSL.

Accordingly, it is possible to prevent the performance of touch sensing from being deteriorated due to an increase in the parasitic capacitance between the touch routing line TL and the display signal line DSL, or an increase in the deviation of the parasitic capacitance.

Furthermore, since the influence by the parasitic capacitance can be reduced, it is possible to increase the width of the touch routing line TL, thereby reducing the resistance of the touch routing line TL.

The boundary point of the touch planarization film BPAC can be applied by a slit and half-tone exposure without affecting a subsequent process. In addition, since the touch planarization film BPAC covers the inclined portion of the encapsulation layer ENCAP, there can be improved a foreign material defect in the corresponding area.

As described above, in the embodiments of the present disclosure, the touch planarization film is located between the inclined portion of the encapsulation layer ENCAP and the touch routing line TL in the non-active area NA of the display panel DISP, so that it is possible to reduce the parasitic capacitance between the touch routing line TL and the display signal line DSL without increasing the non-active area NA.

The touch planarization film BPAC can be disposed in all four edge areas of the display panel DISP as in the above-described example, but in some cases, it may be located only in some of the four edge areas of the display panel DISP.

Figure 14:
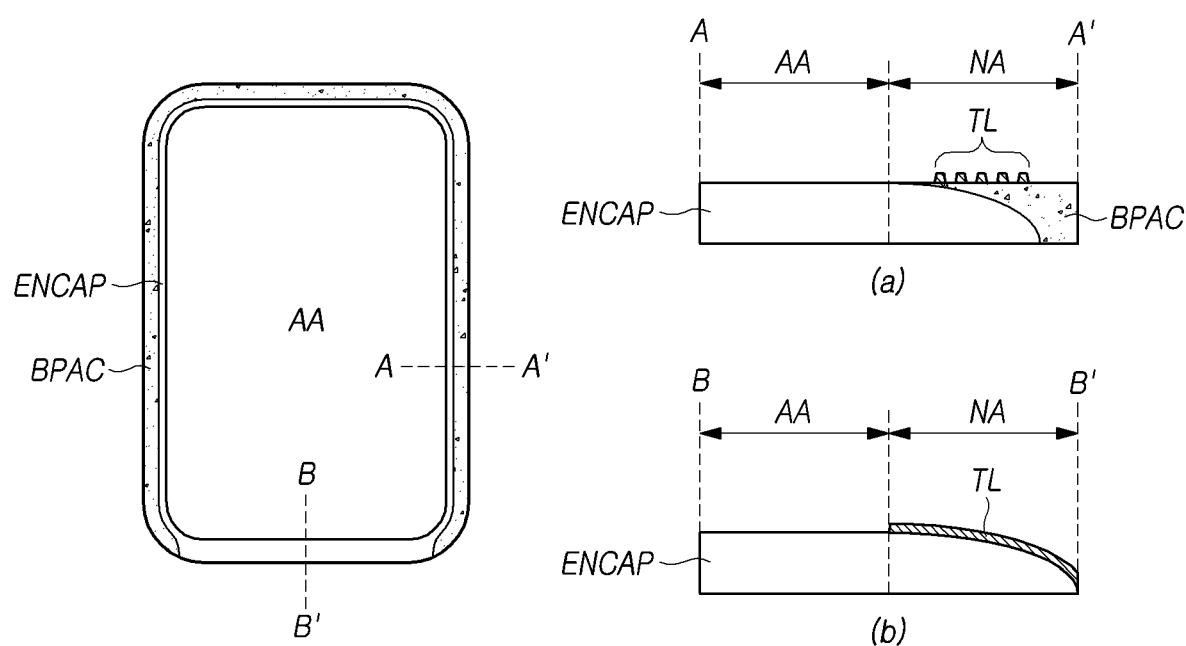
FIG. 14 is a diagram illustrating another example of a structure in which a touch routing line is disposed in a non-active area of a display panel according to embodiments of the present disclosure.

FIG. 14 is a diagram illustrating another example of a structure in which a touch routing line TL is disposed in a non-active area NA of a display panel DISP according to embodiments of the present disclosure.

Referring to FIG. 14, a touch planarization film BPAC can be disposed on some of the four edge areas of the display panel DISP.

For example, the touch planarization film BPAC can be disposed in upper, left, and right edge areas of the display panel DISP. In some cases, the touch planarization film BPAC can be disposed only in left and right edge areas of the display panel DISP.

The area in which the touch planarization film BPAC is disposed can have a cross-sectional structure as illustrated in (a).

The touch planarization film BPAC is disposed in the area where the touch routing line TL is disposed, and can be disposed in an area excluding the area where the touch routing line TL extends to be connected to a touch pad TP.

The touch pad TP can be disposed in a lower edge area of the display panel DISP. Alternatively, the touch pad TP can be disposed in an area after being bent in a structure in which the lower edge area of the display panel DISP is bent.

A gentle slope can be formed since the touch planarization film BPAC is not disposed in an area where the touch routing line TL extends to be connected to the touch pad TP.

In this case, as in the example illustrated in (b), the touch routing line TL can be disposed along the gently inclined surface, so that there can be prevented a crack defect of the touch routing line TL.

Accordingly, a part of the plurality of touch routing lines TL can be disposed on the touch planarization film BPAC, and another part can be disposed on an inclined portion of the encapsulation layer ENCAP.

Also, a part of the plurality of touch routing lines TL can include a portion disposed on the touch planarization film BPAC and a portion disposed on an inclined portion of the encapsulation layer ENCAP.

Therefore, there can be adjusted the area in which the touch planarization film BPAC is disposed in the non-active area NA, so that it is possible to reduce the parasitic capacitance between the touch routing line TL and the display signal line DSL and prevent the occurrence of crack defects of the touch routing line TL.

In addition, it is possible to implement various structures in which the touch routing line TL is easily disposed while reducing the parasitic capacitance between the touch routing line TL and the display signal line DSL by using the thickness adjustment of the touch planarization film BPAC disposed on the encapsulation layer ENCAP.

Figure 15:
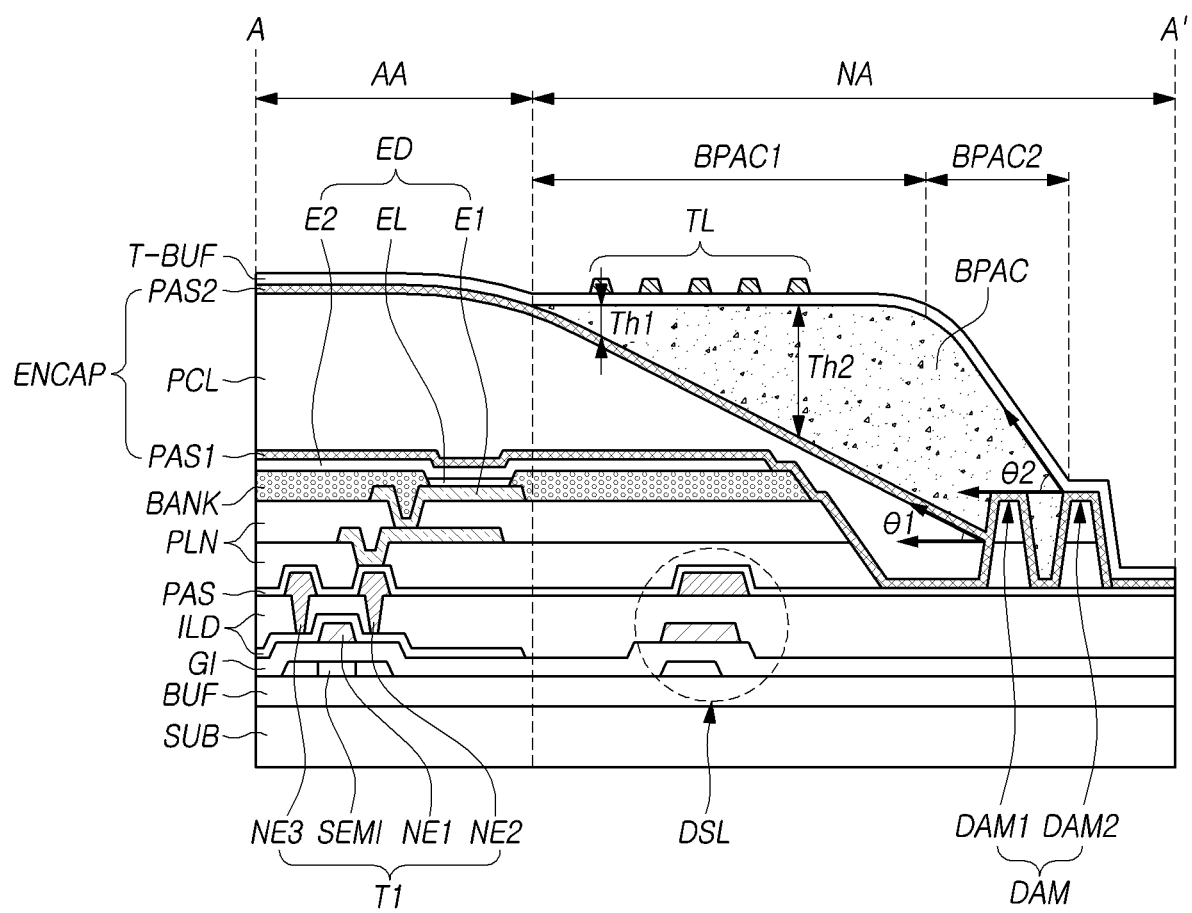
FIGS. 15 to 17 are diagrams illustrating structures in which touch routing line is disposed in a non-active area of a display panel according to embodiments of the present disclosure.
Figure 16:
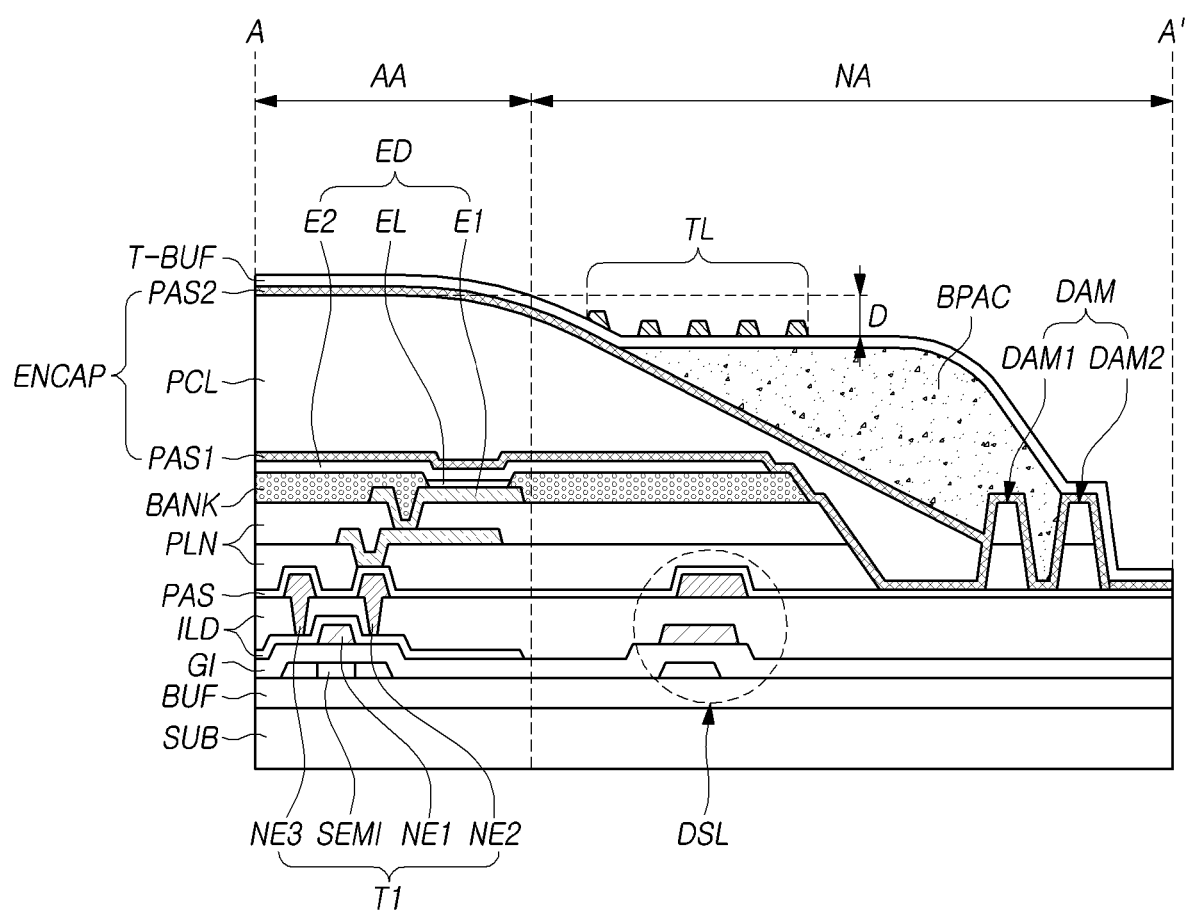
Figure 17:
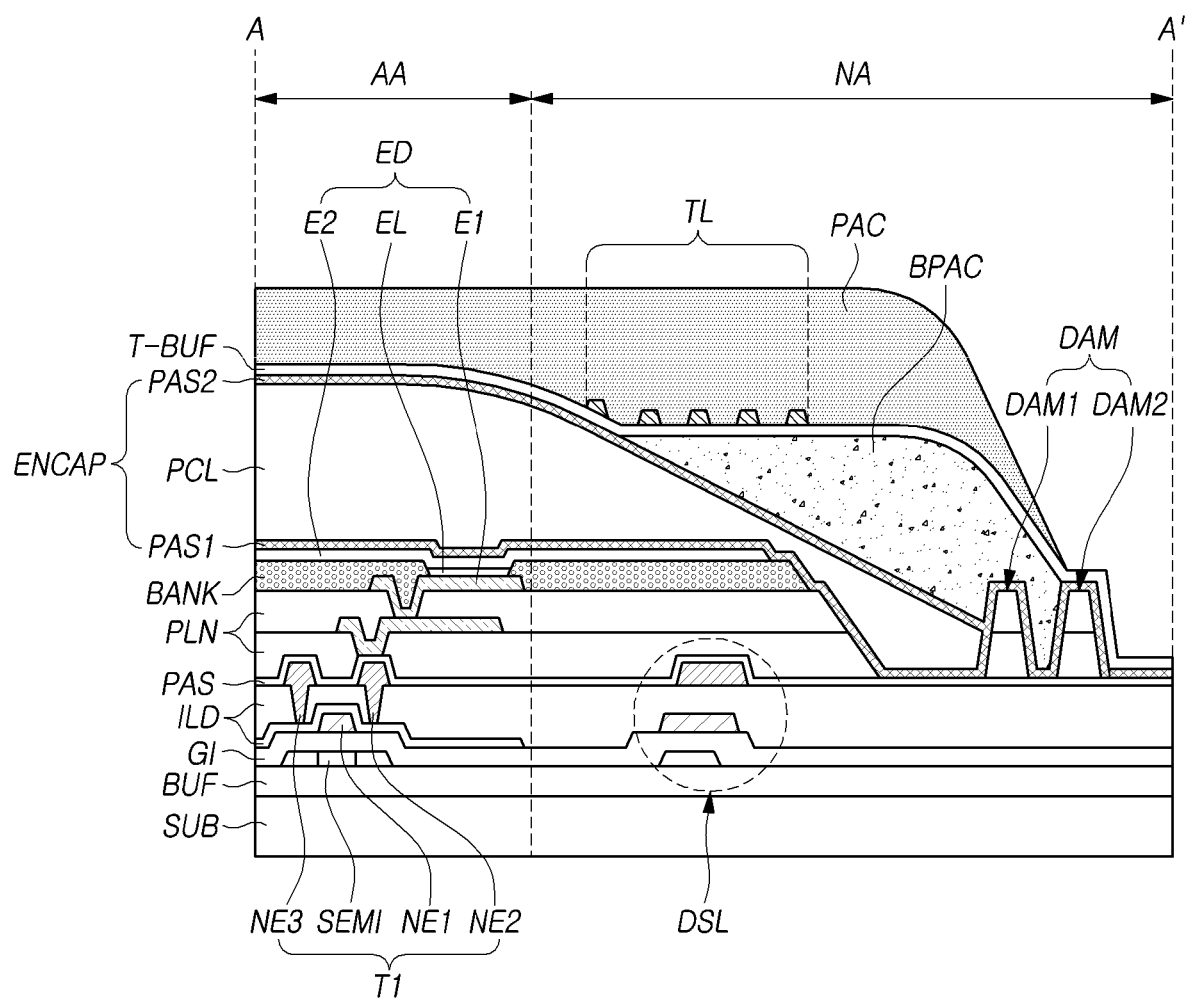

FIGS. 15 to 17 are diagrams illustrating specific structures in which touch routing line TL is disposed in a non-active area NA of a display panel DISP according to embodiments of the present disclosure.

Referring to FIG. 15, a first transistor T1 or a light emitting device ED for driving a display can be disposed in the active area AA. Also, although not shown, a touch electrode TE can be disposed on the encapsulation layer ENCAP in the active area AA. In addition, several insulating films including the buffer film BUF can be disposed, and it will be omitted descriptions of portions overlapping with those described with reference to FIG. 9.

A plurality of display signal lines DSL can be disposed under the encapsulation layer ENACAP in the non-active area NA. The display signal line DSL can be, for example, a clock signal line or a line supplying a driving voltage, but is not limited thereto.

A touch planarization film BPAC can be disposed on the encapsulation layer ENCAP in the non-active area NA.

A touch buffer film T-BUF can be disposed on the touch planarization film BPAC. The touch buffer film T-BUF can be disposed on the encapsulation layer ENCAP in the active area AA and disposed on the touch planarization film BPAC in the non-active area NA.

The touch routing line TL can be disposed on the touch buffer film T-BUF disposed on the touch planarization film BPAC.

The touch planarization film BPAC can be located outside the active area AA.

The touch planarization film BPAC can be disposed so as not to deviate from an outermost boundary of a dam DAM.

The touch planarization film BPAC can include a first portion BPAC1 which is a planarized portion and a second portion BPAC2 which is an inclined portion.

The first portion BPAC1 of the touch planarization film BPAC can be located adjacent to the active area AA.

The second portion BPAC2 of the touch planarization film BPAC can be located adjacent to the dam DAM.

The upper end of the first portion BPAC1 of the touch planarization film BPAC can be located at substantially the same level as the upper end of the encapsulation layer ENCAP. Alternatively, the upper end of the first portion BPAC1 of the touch planarization film BPAC can be positioned slightly lower than the upper end of the encapsulation layer ENCAP.

The touch planarization film BPAC is formed to a predetermined thickness or selected thickness or more, so that it is possible to reduce parasitic capacitance between the touch routing line TL and the display signal line DSL located under the encapsulation layer ENCAP.

Since the upper end of the touch planarization film BPAC is located equal to or slightly lower than the upper end of the encapsulation layer ENCAP, there can be facilitated a process of disposing the touch electrode TE and the touch routing line TL on the touch buffer film T-BUF.

Closer to the active area AA, the thickness of the first portion BPAC1 of the touch planarization film BPAC may decrease.

For example, the thickness Th1 of the first portion BPAC1 of the touch planarization film BPAC disposed under the touch routing line TL located closest to the active area AA can be smaller than a thickness Th2 of the first portion BPAC1 of the touch planarization film BPAC disposed under the touch routing line TL located far from the active area AA.

The step difference of the encapsulation layer ENCAP in the non-active area NA can be compensated by adjusting the thickness of the touch planarization film BPAC.

The second portion BPAC2 of the touch planarization film BPAC is an inclined portion, and the touch routing line TL may not be disposed on the second portion BPAC2 of the touch planarization film BPAC.

The slope of the second portion BPAC2 which is the inclined portion of the touch planarization film BPAC can be different from the slope of the inclined portion of the encapsulation layer ENCAP.

For example, the slope of the second portion BPAC2 of the touch planarization film BPAC may be greater than the slope of the inclined portion of the encapsulation layer ENCAP. The inclination angle $\theta 2$ of the second portion BPAC2 of the touch planarization film BPAC may be greater than the inclination angle $\theta 1$ of the inclined portion of the encapsulation layer ENCAP.

Since the slope of the touch planarization film BPAC is greater than the slope of the encapsulation layer ENCAP, the step difference of the encapsulation layer ENCAP can be compensated by the touch planarization film BPAC.

In some cases, the upper end of the touch planarization film BPAC can be positioned lower than the upper end of the encapsulation layer ENCAP while compensating for the step difference of the encapsulation layer ENCAP by the touch planarization film BPAC.

Referring to FIG. 16, a touch planarization film BPAC can be disposed on an inclined portion of the encapsulation layer ENCAP in the non-active area NA of the display panel DISP.

A plurality of display signal lines DSL can be disposed under the encapsulation layer ENCAP.

A touch buffer film T-BUF can be disposed on a touch planarization film BPAC.

A portion of the touch buffer film T-BUF can be disposed on the encapsulation layer ENCAP, and another portion can be disposed on the touch planarization film BPAC.

The touch planarization film BPAC can be disposed between the encapsulation layer ENCAP and the touch buffer film T-BUF in the non-active area NA.

The touch planarization film BPAC can include a planarized portion and an inclined portion.

A touch routing line TL may be disposed on the planarized portion of the touch planarization film BPAC.

The upper end of the touch planarization film BPAC can be positioned lower than the upper end of the encapsulation layer ENCAP by a predetermined distance D or selected distance D.

Since the upper end of the touch planarization film BPAC is positioned lower than the upper end of the encapsulation layer ENCAP, a part of the plurality of touch routing lines TL can be disposed on the encapsulation layer ENCAP.

Since the touch routing line TL is disposed on the encapsulation layer ENCAP located higher than the touch planarization film BPAC, or disposed on the planarized portion of the touch planarization film BPAC, the parasitic capacitance between the touch routing line TL and the display signal line DSL can be reduced. In addition, a parasitic capacitance deviation between the touch routing lines TL can be reduced.

Since the influence of parasitic capacitance between the touch routing line TL and the display signal line DSL is reduced, it is possible to improve the performance of touch sensing. In addition, the resistance of the touch routing line TL can be reduced by increasing the width of the touch routing line TL.

Since the upper end of the touch planarization film BPAC is located lower than the upper end of the encapsulation layer ENCAP by a predetermined distance or selected distance while increasing a distance between the touch routing line TL and the display signal line DSL by the arrangement of the touch planarization film BPAC, it is possible to easily arrange an electrode metal EM forming the touch electrode line TEL and the touch routing line TL on the encapsulation layer ENCAP and the touch planarization film BPAC.

In addition, in the case that the touch routing line TL extends from the touch planarization film BPAC and is disposed passing a dam DAM, there can be reduced the slope of the touch planarization film BPAC adjacent to the dam DAM, thereby also preventing a crack defect of the touch routing line TL.

As described above, by adjusting the thickness of the touch planarization film BPAC disposed on the inclined portion of the encapsulation layer ENCAP in the non-active area NA, it is possible to prevent deterioration of touch sensing performance due to parasitic capacitance and facilitate arrangement of the electrode metal EM for touch sensing.

A touch protective film PAC can be disposed on an area in which the touch electrode TE and the touch routing line TL are disposed in the active area AA and the non-active area NA. The touch protective film PAC can be disposed to overlap the touch planarization film BPAC disposed in the non-active area NA.

Referring to FIG. 17, the touch planarization film BPAC can be disposed in at least a partial area of the area overlapping the inclined portion of the encapsulation layer ENCAP in the non-active area NA.

The touch planarization film BPAC can include a planarized portion and an inclined portion. The thickness of the planarized portion of the touch planarization film BPAC can decrease as it approaches the active area. The upper end of the touch planarization film BPAC can be located lower than an upper end of the encapsulation layer ENCAP.

A touch buffer film T-BUF can be disposed on the encapsulation layer ENCAP and the touch planarization film BPAC.

A touch routing line TL can be disposed on the touch buffer film T-BUF.

The touch routing line TL can be disposed on an area overlapping the planarized portion of the touch planarization film BPAC.

A touch protective film PAC can be disposed on the touch routing line TL. The touch protective film PAC may be made of substantially the same material as the touch planarization film BPAC, but is not limited thereto.

The touch protective film PAC can protect the touch electrode TE disposed in the active area AA and the touch routing line TL disposed in the non-active area NA.

The touch protective film PAC can be disposed in an area including a region overlapping the touch planarization film BPAC. For example, the outer edge of the touch protective film PAC may overlap the outer edge of the touch planarization film BPAC or may be located outside the outer edge of the touch planarization film BPAC.

Since the touch protective film PAC is disposed in a state in which the touch planarization film BPAC is disposed on the inclined portion of the encapsulation layer ENCA, the thickness of the touch protective film PAC can be reduced. The transmittance of light emitted from the active area AA to the outside can be increased by reducing the thickness of the touch protective film PAC.

According to the above-described embodiments of the present disclosure, the touch planarization film BPAC is disposed on the inclined portion of the encapsulation layer ENCAP in the non-active area NA of the display panel DISP, so that it is possible to compensate a step difference in the inclined portion of the encapsulation layer ENCAP.

In addition, by arranging the touch routing line TL on the planarized portion of the touch planarization film BPAC, it is possible to reduce the parasitic capacitance between the touch routing line TL and the display signal line DSL disposed under the encapsulation layer ENCAP without increasing the non-active area NA.

Further, it is possible to reduce the parasitic capacitance deviation between the touch routing lines TL and easily adjust the width of the touch routing line TL, thereby reducing the load of the touch routing line TL and improving the performance of touch sensing.

The above description has been presented to enable any person skilled in the art to make and use the technical idea of the present disclosure, and has been provided in the context of a particular application and its technical benefits. Various modifications, additions and substitutions to the described embodiments will be readily apparent to those skilled in the art, and the general principles described herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device comprising:
    a transistor including a semiconductor layer, a gate electrode disposed over the semiconductor layer, and source and drain electrodes connected to first and second regions of the semiconductor layer, respectively;
    a capacitor including a first electrode disposed on a same layer as the gate electrode and a second electrode disposed over the first electrode;
    a first planarization layer disposed over the transistor and the capacitor;
    a second planarization layer disposed over the first planarization layer;
    a connection electrode disposed between the first planarization layer and the second planarization layer;
    a light-emitting diode disposed over the second planarization layer, and including an anode electrode, a cathode electrode, and an emitting layer between the anode electrode and the cathode electrode;
    an encapsulation layer covering the light-emitting diode, and including a first inorganic encapsulation layer, an organic encapsulation layer and a second inorganic encapsulation layer stacked sequentially;
    a plurality of touch electrodes disposed over the encapsulation layer;
    first and second dams located on an outer side of the organic encapsulation layer;
    an organic pattern disposed between the first dam and the second dam, the organic pattern being spaced apart from the first dam, and at least a portion of the organic pattern being connected to the first inorganic encapsulation layer or the second inorganic encapsulation layer; and
    a color filter disposed over the encapsulation layer,
    wherein the organic pattern includes an inclined surface that terminates over a sidewall of the second dam facing the first dam.

2. The touch display device of claim 1, wherein the color filter is disposed over the plurality of touch electrodes.

3. The touch display device of claim 1, further comprising:
    a black matrix overlapped with at least one of the plurality of touch electrodes.

4. The touch display device of claim 1, further comprising:
    a touch buffer film disposed over the organic pattern,
    wherein the touch buffer film is in contact with the second inorganic encapsulation layer on an upper surface of the second dam.

5. The touch display device of claim 4, wherein the touch buffer film is further located between the encapsulation layer and the plurality of touch electrodes.

6. The touch display device of claim 4, further comprising:
    a touch pad spaced apart from the organic encapsulation layer with the first and second dams interposed therebetween.

7. The touch display device of claim 6, further comprising:
    a plurality of touch routing lines connected to at least one of the plurality of touch electrodes,
    wherein the touch pad includes a first pad electrode disposed in the same layer as the plurality of touch routing lines.

8. The touch display device of claim 7, wherein the touch pad further includes a second pad electrode under the first pad electrode,
    wherein the second pad electrode is disposed on the same layer as the source and drain electrodes.

9. The touch display device of claim 6, further comprising:
    a touch insulating film disposed over the touch buffer film,
    wherein the touch buffer film and the touch insulating film extend to the touch pad, and a contact hole passes through the touch insulating film and the touch buffer film to expose the touch pad.

10. A touch display device comprising:
    a transistor over a substrate;
    a capacitor including a first electrode disposed on a same layer as a gate electrode of the transistor and a second electrode disposed over the first electrode;
    first and second planarization layers sequentially stacked over the transistor and the capacitor;
    a connection electrode disposed between the first planarization layer and the second planarization layer, and connected to the transistor;
    a light-emitting diode disposed over the second planarization layer;
    an encapsulation layer covering the light-emitting diode, and including a first inorganic encapsulation layer, an organic encapsulation layer and a second inorganic encapsulation layer stacked sequentially;
    a plurality of touch electrodes disposed over the encapsulation layer;
    first and second dams located on an outer side of the organic encapsulation layer; and
    an organic pattern disposed between the first dam and the second dam,
    wherein the first inorganic encapsulation layer or the second inorganic encapsulation layer extends between the organic pattern and the first dam to separate the organic pattern from the first dam,
    wherein at least a portion of the organic pattern is connected to the first inorganic encapsulation layer or the second inorganic encapsulation layer, and
    wherein the organic pattern includes an inclined surface that overlaps with a sidewall of the second dam facing the first dam and does not overlap with a top surface of the second dam.

11. The touch display device of claim 10, wherein the organic encapsulation layer includes an inclined portion,
   wherein the organic pattern is further located over the inclined portion of the organic encapsulation layer.

12. The touch display device of claim 11, wherein the organic pattern comprises:
   a first portion that is planarized; and
   a second portion that is inclined,
   wherein the second portion extends from the first portion to the second dam, and is terminated over an upper surface of the second dam.

13. The touch display device of claim 12, wherein at least a portion of the capacitor is located in an area outside an area overlapping the second portion of the organic pattern.

14. The touch display device of claim 12, further comprising:
   a plurality of touch routing lines connected to at least one of the plurality of touch electrodes,
   wherein the plurality of touch routing lines is located in an area outside an area overlapping the second portion of the organic pattern.

15. The touch display device of claim 12, wherein a slope of the second portion of the organic pattern is greater than a slope of the inclined portion of the organic encapsulation layer.

16. The touch display device of claim 10, further comprising:
   a touch pad spaced apart from the organic encapsulation layer with the first and second dams interposed therebetween.

17. The touch display device of claim 16, wherein the touch pad comprises:
   a first pad electrode; and
   a second pad electrode disposed on the first pad electrode, and in contact with the first pad electrode.

18. The touch display device of claim 17, further comprising:
   a plurality of touch routing lines disposed over the encapsulation layer,
   wherein the first pad electrode is disposed in the same layer as the plurality of touch routing lines, and
   wherein the second pad electrode is disposed on the same layer as source and drain electrodes of the transistor.

* * * * *